United States Patent
Kimura et al.

(10) Patent No.: US 9,766,517 B2
(45) Date of Patent: Sep. 19, 2017

(54) DISPLAY DEVICE AND DISPLAY MODULE

(71) Applicant: SEMICONDUCTOR ENERGY LABORATORY CO., LTD., Atsugi-shi, Kanagawa-ken (JP)

(72) Inventors: Hajime Kimura, Kanagawa (JP); Tetsuji Ishitani, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/840,782

(22) Filed: Aug. 31, 2015

(65) Prior Publication Data

US 2016/0070131 A1    Mar. 10, 2016

(30) Foreign Application Priority Data

Sep. 5, 2014 (JP) ................................. 2014-181552

(51) Int. Cl.
  *G02F 1/1345*    (2006.01)
  *G02F 1/1362*    (2006.01)
  (Continued)

(52) U.S. Cl.
  CPC ........ *G02F 1/13454* (2013.01); *G02F 1/1362* (2013.01); *G02F 1/136213* (2013.01);
  (Continued)

(58) Field of Classification Search
  CPC ........... G02F 1/136213; G02F 1/13454; G02F 1/13452; G02F 1/1345; G02F 1/1362; G02F 1/136204
  See application file for complete search history.

(56) References Cited

U.S. PATENT DOCUMENTS 5,731,856 A    3/1998    Kim et al.
5,744,864 A    4/1998    Cillessen et al.
                (Continued)

FOREIGN PATENT DOCUMENTS

EP    1737044 A    12/2006
EP    2226847 A    9/2010
                (Continued)

OTHER PUBLICATIONS

Coates.D et al., "Optical Studies of the Amorphous Liquid-Cholesteric Transition:The "Blue Phase"", Physics Letters, Sep. 10, 1973, vol. 45A, No. 2, pp. 115-116.
(Continued)

*Primary Examiner* — Dennis Y Kim
(74) *Attorney, Agent, or Firm* — Nixon Peabody LLP; Jeffrey L. Costellia

(57) ABSTRACT

To provide a display device or the like that enables stable curing of a resin. The display device includes a first circuit and a second circuit over the same substrate. The first circuit has a function of performing display; the second circuit has a function of driving the first circuit; the second circuit includes a transistor and a capacitor; the transistor includes an oxide semiconductor layer over a first insulating layer; the capacitor includes a first conductive layer, a second insulating layer, and a second conductive layer; the first conductive layer is positioned over the first insulating layer; one of a source and a drain of the transistor is electrically connected to the second conductive layer; and the first conductive layer and the oxide semiconductor layer include the same metal element.

17 Claims, 12 Drawing Sheets

(51) Int. Cl.
  *H01L 27/12* (2006.01)
  *H01L 29/786* (2006.01)
(52) U.S. Cl.
  CPC ...... *H01L 27/1225* (2013.01); *H01L 27/1255* (2013.01); *H01L 29/7869* (2013.01); *G02F 2202/28* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,927,985 B2 | 1/2015 | Matsukura |
| 8,937,307 B2 | 1/2015 | Yamazaki |
| 8,975,695 B2 | 3/2015 | Yamazaki |
| 8,981,372 B2 | 3/2015 | Yamazaki |
| 9,018,624 B2 | 4/2015 | Yamazaki |
| 9,425,220 B2 * | 8/2016 | Miyake ............... H01L 27/1255 |
| 9,437,741 B2 * | 9/2016 | Yamazaki ......... H01L 29/78606 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0188671 A1 * | 8/2007 | Hwang ............ G02F 1/136213 349/43 |
| 2007/0194379 A1 | 8/2007 | Hosono et al. |
| 2007/0252928 A1 * | 11/2007 | Ito ................. G02F 1/1362 349/106 |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0079001 A1 * | 4/2008 | Umezaki ............... H01L 27/12 257/59 |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141203 A1 * | 6/2009 | Son .................. G02F 1/136213 349/39 |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163874 A1 * | 7/2010 | Koyama ................ H01L 27/12 257/57 |
| 2011/0122330 A1 * | 5/2011 | Tae ................... G02F 1/136213 349/39 |
| 2014/0014948 A1 | 1/2014 | Matsukura |
| 2014/0034954 A1 | 2/2014 | Yamazaki et al. |
| 2014/0042432 A1 | 2/2014 | Yamazaki |
| 2014/0061636 A1 | 3/2014 | Miyake et al. |
| 2014/0061654 A1 | 3/2014 | Yamazaki et al. |
| 2014/0175432 A1 | 6/2014 | Yamazaki et al. |
| 2014/0183523 A1 | 7/2014 | Endo |
| 2014/0183528 A1 | 7/2014 | Endo |
| 2014/0313446 A1 | 10/2014 | Kubota |
| 2014/0326993 A1 | 11/2014 | Oikawa et al. |
| 2014/0333864 A1 | 11/2014 | Miyake et al. |
| 2015/0108474 A1 | 4/2015 | Yamazaki et al. |
| 2015/0115259 A1 | 4/2015 | Yamazaki et al. |
| 2015/0155169 A1 | 6/2015 | Oota et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |

(56) References Cited

FOREIGN PATENT DOCUMENTS

| | | |
|---|---|---|
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-123861 A | 5/2007 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello. M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of the Blue Phases in the Chiral Networks", Liquid Crystals, 1993, vol. 14, No. 3, pp. 911-916.

Kimizuka.N et al., "Syntheses and Single-Crystal Data of Homologous Compounds In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions of Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters ) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symoposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMCLDs", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined with Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Application", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

(56) References Cited

OTHER PUBLICATIONS

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m <4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn, J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas ", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO)TFT", SID Digest '08 : SID International Symposium Digest of Technical Papers, May 20, 2008, vol. 39, pp. 633-636.

Park.Sang-Hee et al., "32.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

FIG. 1A
FIG. 1B
FIG. 1C
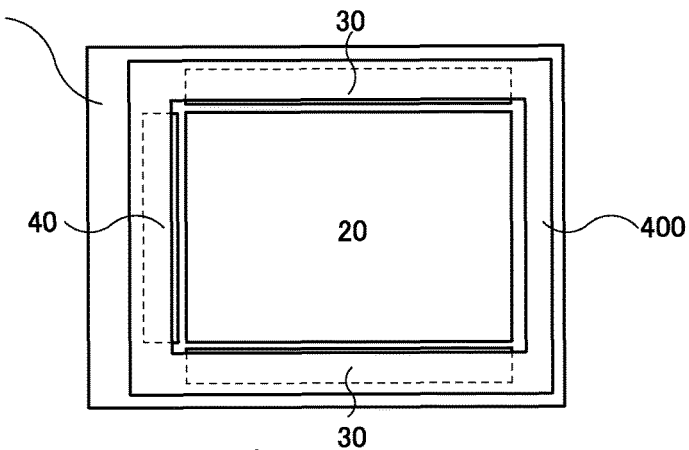
FIG. 1D
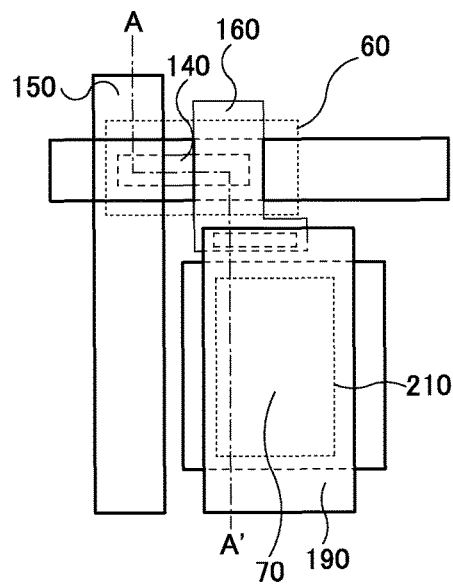
FIG. 1E
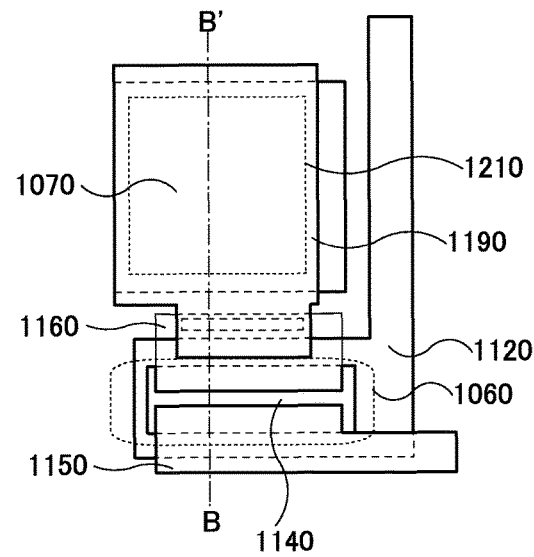

DISPLAY DEVICE AND DISPLAY MODULE

BACKGROUND OF THE INVENTION

1. Field of the Invention

One embodiment of the present invention relates to a display device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

Display devices in which a display region (a pixel portion) and a peripheral circuit (a driver portion) are provided in the same substrate have been widely used. For example, Patent Document 1 discloses a technique of using oxide semiconductor transistors in the display region and the peripheral circuit.

REFERENCE

Patent Document

[Patent Document 1] Japanese Published Patent Application No. 2007-123861

SUMMARY OF THE INVENTION

For example, in the manufacture of a display device that uses a liquid crystal element and includes a display region (a pixel portion) and a peripheral circuit (a driver portion) in the same substrate, the substrate is attached to another substrate with use of a resin. The resin, which is cured by a variety of methods after being formed on the substrates, needs to be cured sufficiently for the attachment.

An object of one embodiment of the present invention is to provide a display device or the like that enables stable curing of a resin.

Another object of one embodiment of the present invention is to provide a display device or the like that is inexpensive and has improved productivity.

Another object of one embodiment of the present invention is to provide a display device or the like including a capacitor portion capable of increasing capacitance without increasing its area.

Another object of one embodiment of the present invention is to provide a high-definition display device.

Another object of one embodiment of the present invention is to provide a lightweight display device.

Another object of one embodiment of the present invention is to provide a highly reliable display device.

Another object of one embodiment of the present invention is to provide a low-power display device.

Another object of one embodiment of the present invention is to provide a large-area display device.

Another object of one embodiment of the present invention is to provide a novel display device or the like.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a display device in which a first circuit and a second circuit are provided over the same substrate. The first circuit has a function of performing display; the second circuit has a function of driving the first circuit; the second circuit includes a transistor and a capacitor; the transistor includes an oxide semiconductor layer over a first insulating layer; the capacitor includes a first conductive layer, a second insulating layer, and a second conductive layer; the first conductive layer is positioned over the first insulating layer; one of a source and a drain of the transistor is electrically connected to the second conductive layer; and the first conductive layer and the oxide semiconductor layer include the same metal element.

In the aforementioned display device, the first conductive layer and the second conductive layer can have a light-transmitting property.

In the aforementioned display device, the first conductive layer can include a region with a hydrogen concentration higher than that of the oxide semiconductor layer.

In the aforementioned display device, the second insulating layer can include a silicon nitride film.

In the aforementioned display device, the first circuit can include a liquid crystal element.

In the aforementioned display device, the first circuit can include an organic EL element.

One embodiment of the present invention is a display device in which a first circuit and a second circuit are provided over the same substrate. The first circuit has a function of performing display; the second circuit has a function of driving the first circuit; the second circuit includes a transistor, a first capacitor, and a second capacitor; the transistor includes an oxide semiconductor layer over a first insulating layer; the first capacitor includes a first conductive layer, the first insulating layer, and a second conductive layer; the second capacitor includes the second conductive layer, a second insulating layer, and a third conductive layer; the second conductive layer is positioned over the first insulating layer; one of a source and a drain of the transistor is electrically connected to the second conductive layer; the first conductive layer and the third conductive layer are electrically connected to each other; and the first conductive layer and the oxide semiconductor layer include the same metal element.

In the aforementioned display device, the first conductive layer, the second conductive layer, and the third conductive layer can have a light-transmitting property.

Note that other embodiments of the present invention will be shown below in the description of Embodiments and the drawings.

One embodiment of the present invention can provide a display device or the like that enables stable curing of a resin.

Another embodiment of the present invention can provide a display device or the like that is inexpensive and has improved productivity.

Another embodiment of the present invention can provide a display device or the like including a capacitor portion capable of increasing capacitance without increasing its area.

Another embodiment of the present invention can provide a high-definition display device.

Another embodiment of the present invention can provide a lightweight display device.

Another embodiment of the present invention can provide a highly reliable display device.

Another embodiment of the present invention can provide a low-power display device.

Another embodiment of the present invention can provide a large-area display device.

Another embodiment of the present invention can provide a novel display device or the like.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

In the accompanying drawings:

FIGS. 1A to 1E are circuit diagrams and top views illustrating a display device of one embodiment of the present invention;

DETAILED DESCRIPTION OF THE INVENTION

Figure 2A:
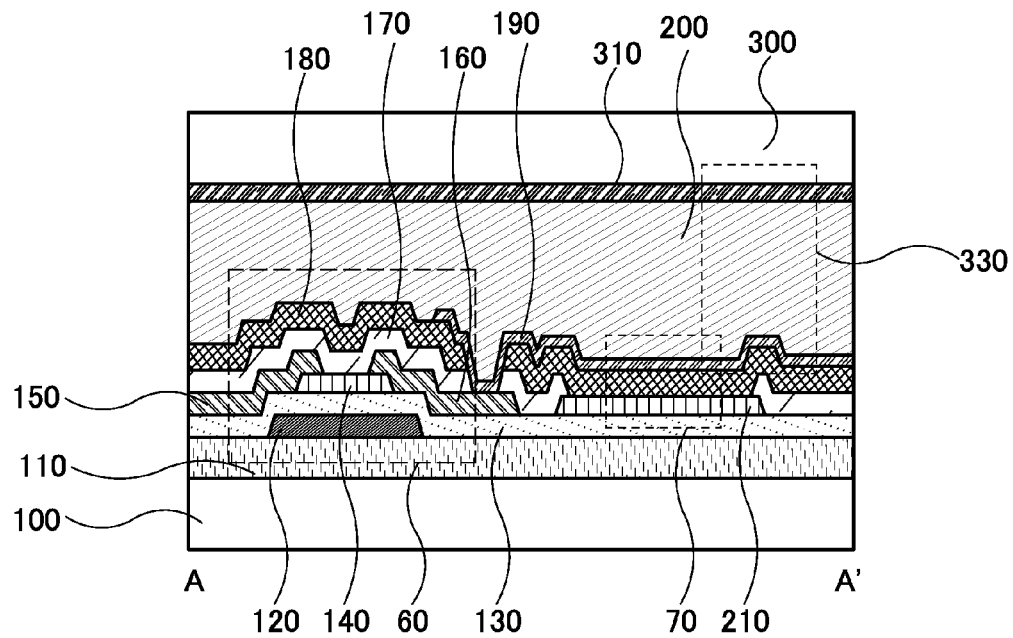
FIGS. 2A and 2B are cross-sectional views illustrating the display device of one embodiment of the present invention.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and the description of such portions is not repeated.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Since the source and the drain of the transistor change depending on the structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode.

Note that in this specification, ordinal numbers such as first, second, and third are used to avoid confusion among components, and thus do not limit the number of the components.

Note that in this specification, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

Note that for example, any of the following expressions can be used for the case where a source (or a first terminal or the like) of a transistor is electrically connected to X through Z1 (or not through Z1) and a drain (or a second terminal or the like) of the transistor is electrically connected to Y through Z2 (or not through Z2), or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other such that X, the source (or the first terminal or the like) of the transistor, the drain (or the second terminal or the like) of the transistor, and Y are electrically connected to each other in this order"; "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order"; and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Another example of the expression is "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through Z1 on at least a first connection path, the first connection path does not include a second connection path, the second connection path includes a connection path through the transistor, a drain (or a second terminal or the like) of the transistor is electrically connected to Y through Z2 on at least a third connection path, and the third connection path does not include the second connection path." It is also possible to use the expression "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are only examples, and there is no limitation on the expressions. Here, X, Y, Z1, and Z2 each denote an object (e.g., a device, an element, a circuit, a wiring, an electrode, a terminal, a conductive film, or a layer).

Note that in this specification, terms for explaining arrangement, such as "over" and "under", are used for convenience to describe the positional relationship between components with reference to drawings. The positional relationship between components is changed as appropriate in accordance with a direction in which each component is described. Thus, the positional relationship is not limited to that described with a term used in this specification and can be explained with another term as appropriate depending on the situation.

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that the angle formed between two straight lines ranges from 60° to 120°.

In this specification, trigonal and rhombohedral crystal systems are included in a hexagonal crystal system.

(Embodiment 1)

In this embodiment, a structure example of a display device will be described.

(Circuit Diagrams and Top Views of FIGS. 1A to 1E)

FIG. 1A illustrates a display device 10. In this specification and the like, the display device 10 refers to, for example, a device including a display element such as a liquid crystal element. The display device 10 includes a circuit 20 and a circuit 30 which are formed over the same substrate. The circuit 20 can mainly constitute a display region including pixels. The circuit 30 can, for example, drive and control the circuit 20. Alternatively, the circuit 30 may have a function as a protective circuit or a test circuit. The circuit 30 is, for example, at least one of a gate driver, a protective circuit, a precharge circuit, a test circuit, and the like. The circuit 30 may be provided on either or both sides of the circuit 20. In addition, the display device 10 may include a circuit 40 over the same substrate. Similarly to the circuit 30, the circuit 40 can drive and control the circuit 20. The circuit 40 is, for example, at least one of a source driver, a switch, and the like. Furthermore, the display device 10 includes at least one of a control circuit, a power source circuit, a signal generation circuit, an optical sheet, a touch sensor, a touch sensor driver circuit, a photosensor, a backlight, a frame, and the like, and is also referred to as a display panel or a display module. In the display device 10, the circuit 40 is not necessarily provided over the same substrate.

FIG. 1B is a basic circuit diagram of a pixel circuit included in the circuit 20. The circuit illustrated in FIG. 1B includes a transistor, a capacitor, and a liquid crystal element. FIG. 1D is a top view of the circuit 20. FIG. 2A is a cross-sectional view along a dashed-dotted line A-A' in the top view of the circuit 20.

Figure 2B:
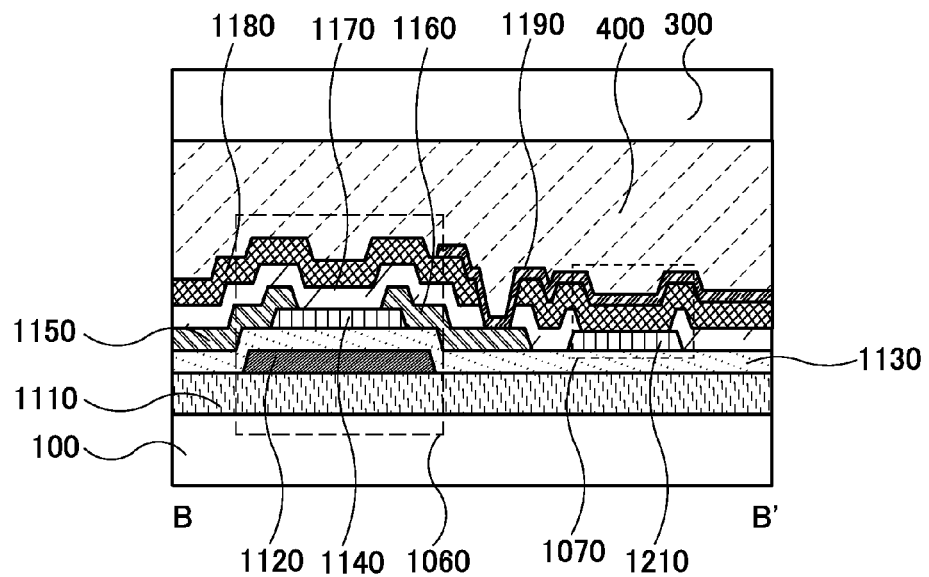

FIG. 1C is a circuit diagram illustrating part of the structure of the circuit 30. FIG. 1E is a top view of the circuit 30. FIG. 2B is a cross-sectional view along a dashed-dotted line B-B' in the top view of the circuit 30. Note that the circuit illustrated in FIG. 1C can serve as, for example, part of a buffer circuit, and includes a transistor 11, a transistor 12, a transistor 13, and a capacitor C1. Although the capacitor C1 is connected between a gate and a source of the transistor 12 in FIG. 1C, one embodiment of the present invention is not limited thereto and the capacitor C1 may be connected at another node. Also in FIG. 1C, signals and potentials such as VDD, VSS, and CLK are supplied as an example; however, one embodiment of the present invention is not limited thereto and another signal or potential may be supplied.

<Cross-Sectional Schematic View of Display Device>

Cross-sectional views of the display device 10 will be described with reference to FIGS. 2A and 2B. Note that the description is made on the assumption that the display device 10 is mainly a display panel using a liquid crystal. However, the display element is not limited to a liquid crystal element using a liquid crystal and may be another display element such as an organic EL element.

The display device is constituted by components provided between a substrate 100 and a substrate 300. A liquid crystal element 330 is included between the substrate 100 and the substrate 300 (see FIG. 2A).

A liquid crystal layer 200 is sealed by an adhesive layer 400 provided between the substrate 100 and the substrate 300. At least part of the adhesive layer 400 can be provided over at least part of the circuit 30 or over at least part of elements included in the circuit 30 as illustrated in FIG. 1A and FIG. 2B. Note that the adhesive layer 400 and at least part of the circuit 30 do not necessarily overlap with each other. The adhesive layer 400 may be provided in the vicinity of at least part of the circuit.

<<Circuit 20>>

First, a cross-sectional structure of a pixel portion included in the circuit 20 will be described with reference to FIG. 2A.

A transistor 60 and a capacitor 70 are provided over the substrate 100.

<<Transistor 60>>

The transistor 60 includes an insulating layer 110, a conductive layer 120, an insulating layer 130, a semiconductor layer 140, a conductive layer 150, a conductive layer 160, an insulating layer 170, and an insulating layer 180. The conductive layer 120 has a function as a gate electrode. The insulating layer 130 has a function as a gate insulating film. The semiconductor layer 140 has a function as a semiconductor layer including a channel formation region. The conductive layer 150 has a function as one of a source electrode and a drain electrode. The conductive layer 160 has a function as the other of the source electrode and the drain electrode. The conductive layer 160 is connected to a conductive layer 190. The insulating layer 170 can be used to protect a channel portion. The insulating layer 180 can be used to prevent diffusion of impurities.

In FIG. 2A, the area of a top surface of the semiconductor layer 140 is preferably equal to or smaller than that of a top surface of the conductive layer 120.

In FIG. 2A, the conductive layer 120, the insulating layer 130, the semiconductor layer 140, the conductive layer 150, or the conductive layer 160 is a single layer; however, they may be a stack of two or more layers. The layers in the stack may be formed using different materials or the same material.

Figure 3A:
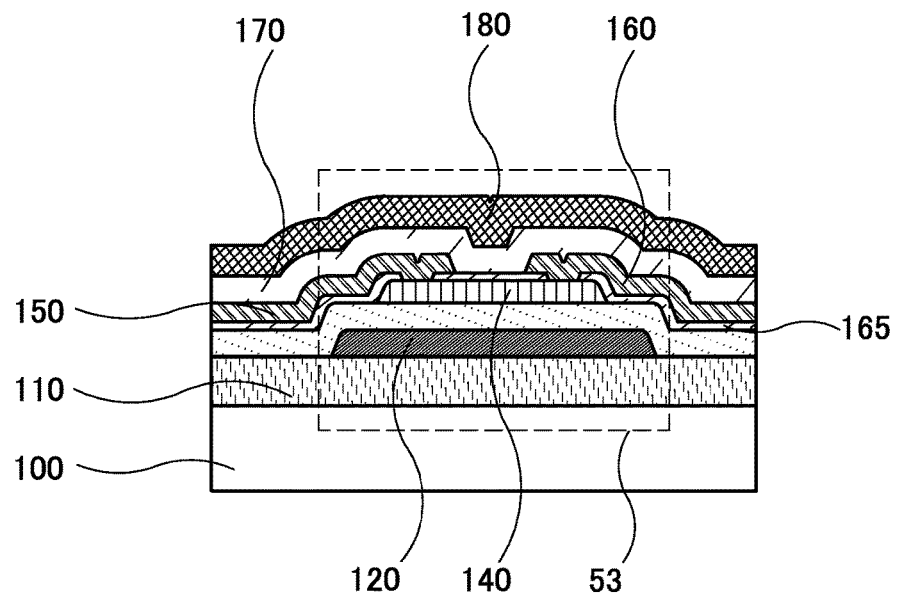
FIGS. 3A and 3B are cross-sectional views each illustrating a transistor of one embodiment of the present invention.
Figure 3B:
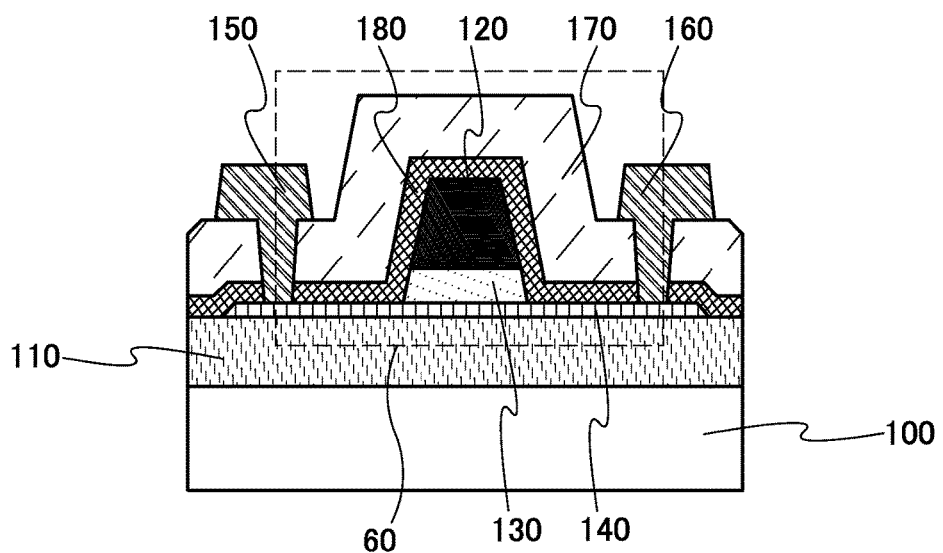

The transistor 60 illustrated in FIG. 2A is, but is not limited to, a bottom-gate transistor. FIGS. 3A and 3B show modification examples of the transistor 60. Although the transistor 60 illustrated in FIG. 2A is a channel-etched transistor, it may be a channel-protective transistor including an insulating layer 165 as illustrated in the cross-sectional view of FIG. 3A or may be a top-gate transistor as illustrated in the cross-sectional view of FIG. 3B.

When a transistor with an extremely low off-state leakage current is used as the transistor 60 connected to a display element (e.g., the liquid crystal element 330), the time for holding image signals can be extended. For example, images can be held even when the frequency of writing image signals is higher than or equal to 11.6 μHz (once a day) and less than 0.1 Hz (0.1 times a second), preferably higher than or equal to 0.28 mHz (once an hour) and less than 1 Hz (once a second). As a result, the frequency of writing image signals can be reduced, leading to a reduction in the power consumption of the display device 10. Needless to say, the frequency of writing image signals can be higher than or equal to 1 Hz, preferably higher than or equal to 30 Hz (30 times a second), further preferably higher than or equal to 60 Hz (60 times a second) and less than 960 Hz (960 times a second).

An example of the transistor with an extremely low off-state leakage current is a transistor in which an oxide semiconductor is used for a semiconductor layer. Specifically, for the semiconductor layer, an oxide semiconductor containing at least indium (In), zinc (Zn), and M (M is a metal such as Al, Ga, Ge, Y, Zr, Sn, La, Ce, or Hf), which is represented by an In-M-Zn oxide, can be preferably used.

In the case where the voltage between a source and a drain is set to about 0.1 V, 5 V, or 10 V, for example, the off-state current standardized on the channel width of the transistor in which an oxide semiconductor is used for the semiconductor layer can be as low as several yoctoamperes per micrometer to several zeptoamperes per micrometer.

<<Oxide Semiconductor>>

As an oxide semiconductor used for the aforementioned semiconductor layer 140, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, and an In—Ga-based oxide.

Note that here, an "In—Ga—Zn-based oxide" means an oxide containing In, Ga, and Zn as its main components and there is no limitation on the ratio of In:Ga:Zn. The In—Ga—Zn-based oxide may contain another metal element in addition to In, Ga, and Zn.

From the above reason, the use of a transistor including an oxide semiconductor allows fabrication of a low-power display device.

<<Capacitor 70>>

The capacitor 70 includes the conductive layer 190, the insulating layer 180, and a conductive layer 210. The conductive layer 190 has a function as one electrode of the capacitor 70. The conductive layer 210 has a function as the other electrode of the capacitor 70. The insulating layer 180 is provided between the conductive layer 190 and the conductive layer 210. The conductive layer 190 is connected to the transistor 60.

The conductive layer 210 as well as the semiconductor layer 140 is formed over the insulating layer 130.

When the transistor 60 includes an oxide semiconductor in the semiconductor layer 140, the conductive layer 210 can be formed of the same material as the semiconductor layer 140 over the insulating layer 130. In that case, the conductive layer 210 is formed by processing a film formed at the same time as the semiconductor layer 140, and therefore contains elements similar to those in the semiconductor layer 140. The conductive layer 210 has a crystal structure similar to or different from that of the semiconductor layer 140. When the film formed at the same time as the semiconductor layer 140 includes impurities or oxygen vacancies, the film can have conductivity to be the conductive layer 210. Typical examples of the impurities contained in the conductive layer 210 are a rare gas, hydrogen, boron, nitrogen, fluorine, aluminum, and phosphorus. Typical examples of the rare gas include helium, neon, argon, krypton, and xenon. Note that the conductive layer 210 has conductivity as an example; however, one embodiment of the present invention is not limited to this example and the conductive layer 210 does not necessarily have conductivity depending on the case or circumstances. In other words, the conductive layer 210 may have properties similar to those of the semiconductor layer 140.

Although the semiconductor layer 140 and the conductive layer 210 are formed over the insulating layer 130 in the above manner, they have different impurity concentrations. Specifically, the impurity concentration of the conductive layer 210 is higher than that of the semiconductor layer 140.

For example, in the semiconductor layer 140, the hydrogen concentration measured by secondary ion mass spectrometry is lower than or equal to $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$, and yet still further preferably lower than or equal to $1 \times 10^{16}$ atoms/cm$^3$. In contrast, the hydrogen concentration in the conductive layer 210 measured by secondary ion mass spectrometry is higher than or equal to $8 \times 10^{19}$ atoms/cm$^3$, preferably higher than or equal to $1 \times 10^{20}$ atoms/cm$^3$, and further preferably higher than or equal to $5 \times 10^{20}$ atoms/cm$^3$. In addition, the hydrogen concentration in the conductive layer 210 is greater than or equal to 2 times or greater than or equal to 10 times that in the semiconductor layer 140.

When the hydrogen concentration in the semiconductor layer 140 is set in the aforementioned range, generation of electrons serving as carriers in the semiconductor layer 140 can be suppressed.

When an oxide semiconductor film formed at the same time as the semiconductor layer 140 is exposed to plasma, the oxide semiconductor film is damaged and oxygen vacancies can be generated. For example, when a film is formed over the oxide semiconductor film by a plasma CVD method or a sputtering method, the oxide semiconductor film is exposed to plasma and oxygen vacancies are generated. Alternatively, when the oxide semiconductor film is exposed to plasma in etching treatment for formation of an opening in the insulating layer 170, oxygen vacancies are generated. Alternatively, when the oxide semiconductor film is exposed to plasma of a mixed gas of oxygen and hydrogen, hydrogen, a rare gas, ammonia, and the like, oxygen vacancies are generated. Alternatively, when impurities are added to the oxide semiconductor film, oxygen vacancies can be formed while the impurities are added to the oxide semiconductor film. The impurities can be added by an ion doping method, an ion implantation method, a plasma treatment method, and the like. In the plasma treatment method, plasma is generated in a gas atmosphere containing the impurities to be added, and ions of the impurities accelerated by plasma treatment are made to collide with the oxide semiconductor film, whereby oxygen vacancies can be formed in the oxide semiconductor film.

When an impurity, e.g., hydrogen is contained in the oxide semiconductor film in which oxygen vacancies are generated by addition of impurity elements, hydrogen enters an oxygen vacant site and forms a donor level in the vicinity of the conduction band. As a result, the oxide semiconductor film has increased conductivity to be a conductor. An oxide semiconductor film that has become a conductor can be referred to as an oxide conductor film. That is, it can be said that the semiconductor layer 140 is formed of an oxide semiconductor and the conductive layer 210 is formed of an oxide conductor film. It can also be said that the conductive layer 210 is formed of an oxide semiconductor film having high conductivity or a metal oxide film having high conductivity.

Note that the insulating layer 180 preferably contains hydrogen. Since the conductive layer 210 is in contact with the insulating layer 180, hydrogen contained in the insulating layer 180 can be diffused into the oxide semiconductor film formed at the same time as the semiconductor layer 140. As a result, impurities can be added to the oxide semiconductor film formed at the same time as the semiconductor layer 140.

Furthermore, the insulating layer 170 is preferably formed using an oxide insulating film containing more oxygen than that in the stoichiometric composition, and the insulating layer 180 is preferably formed using an insulating film containing hydrogen. When oxygen contained in the insulating layer 170 is transferred to the semiconductor layer 140 of the transistor 60, the amount of oxygen vacancies in the semiconductor layer 140 can be reduced and a change in the electrical characteristics of the transistor 60 can be reduced. In addition, hydrogen contained in the insulating layer 180 is transferred to the conductive layer 210 to increase the conductivity of the conductive layer 210.

In the above manner, the conductive layer 210 can be formed at the same time as the semiconductor layer 140 and is given conductivity after the formation. Such a structure results in a reduction in manufacturing costs.

Oxide semiconductor films generally have a visible light transmitting property because of their large energy gap. In contrast, an oxide conductor film is an oxide semiconductor film having a donor level in the vicinity of the conduction band. Thus, the influence of light absorption due to the donor level is small, so that an oxide conductor film has a visible light transmitting property comparable to that of an oxide semiconductor film.

From the above reasons, the conductive layer 190 and the conductive layer 210 have a light-transmitting property; as a result, the whole capacitor 70 can have a light-transmitting property.

The aforementioned structure leads to an increase in the aperture ratio of a pixel in the display region. The increase in aperture ratio allows display to be performed at the same luminance with a weaker light from a backlight, reducing power consumption.

The conductive layer 190 has a function as a pixel electrode of the liquid crystal layer 200. The conductive layer 190 is formed using a conductive film that transmits visible light. For example, a material including one of indium (In), zinc (Zn), and tin (Sn) can be used for the conductive film that transmits visible light. Alternatively, the conductive layer 210 can be used as the pixel electrode. The conductive layer 190 is formed using a conductive film that transmits visible light or a conductive film that reflects visible light. When the conductive layer 190 is formed using a conductive film that transmits visible light, a transmissive display device can be manufactured. When the conductive layer 190 is formed using a conductive film that reflects visible light, a reflective or semi-transmissive display device can be manufactured.

Figure 4A:
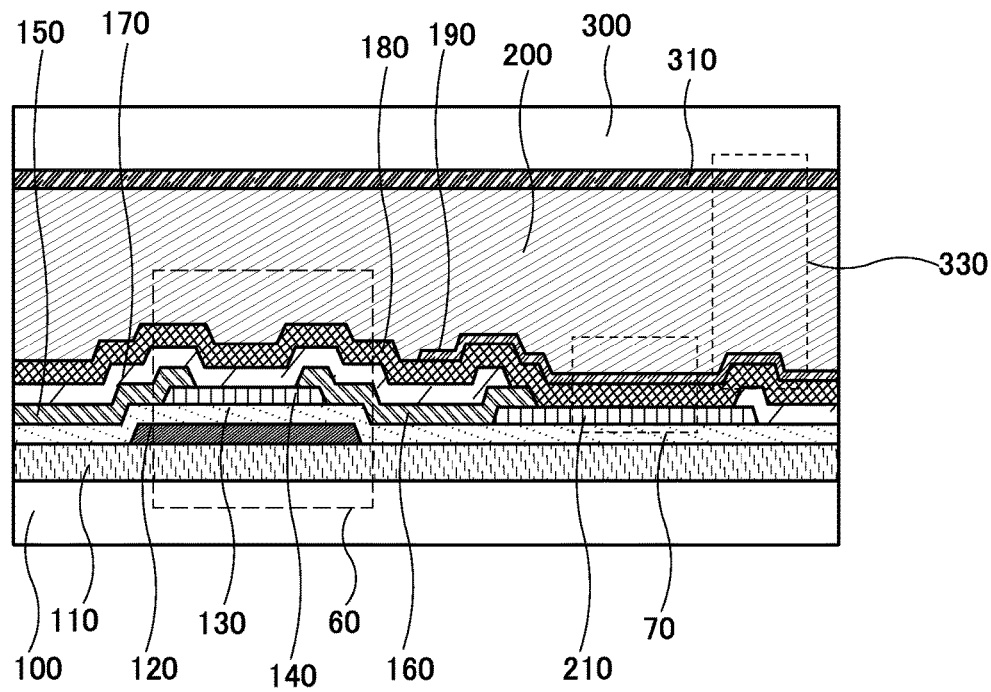
FIGS. 4A and 4B are cross-sectional views each illustrating a display device of one embodiment of the present invention.

Note that the conductive layer 160 may be connected to the conductive layer 210 as illustrated in the cross-sectional view of FIG. 4A.

<<Liquid Crystal Element>>

The liquid crystal layer 200 is interposed between the conductive layer 190 and a conductive layer 310 provided on the substrate 300 and receives the electric field from the conductive layers 190 and 310, so that the liquid crystal element 330 functions. Note that the liquid crystal element 330 does not necessarily include the conductive layer 310.

Examples of a driving method of the display device include a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the driving method of the display device include an electrically controlled birefringence (ECB) mode, a polymer dispersed liquid crystal (PDLC) mode, a polymer network liquid crystal (PNLC) mode, and a guest-host mode. Note that one embodiment of the present invention is not limited to the above, and various liquid crystal elements and driving methods can be employed.

The liquid crystal element 330 may be formed using a liquid crystal composition including a liquid crystal exhibiting a nematic phase and a chiral material. In that case, a cholesteric phase or a blue phase is exhibited. The liquid crystal exhibiting a blue phase has a short response time of 1 msec or less. Since the liquid crystal exhibiting a blue phase is optically isotropic, alignment treatment is not necessary and viewing angle dependence is small.

The substrate 300 includes the conductive layer 310 and the liquid crystal layer 200 is interposed between the conductive layers 310 and 190, so that the liquid crystal element 330 can be obtained. The alignment of liquid crystal molecules included in the liquid crystal layer 200 can be controlled by the electric field between the conductive layers 190 and 310.

<<Circuit 30>>

Next, the circuit 30 in the display device will be described.

The circuit 30 includes a transistor 1060 and a capacitor 1070.

<<Transistor 1060>>

The transistor 1060 includes an insulating layer 1110, a conductive layer 1120, an insulating layer 1130, a semiconductor layer 1140, a conductive layer 1150, a conductive layer 1160, an insulating layer 1170, and an insulating layer 1180. The conductive layer 1120 has a function as a gate electrode. The insulating layer 1130 has a function as a gate insulating film. The semiconductor layer 1140 has a function as a semiconductor layer including a channel formation region. The conductive layer 1150 has a function as one of a source electrode and a drain electrode. The conductive layer 1160 has a function as the other of the source electrode and the drain electrode. The conductive layer 1160 is connected to a conductive layer 1190. The insulating layer 1170 can be used to protect a channel portion. The insulating layer 1180 can be used to prevent diffusion of impurities.

<<Capacitor 1070>>

The capacitor 1070 includes the conductive layer 1190, the insulating layer 1180, and a conductive layer 1210. The conductive layer 1190 has a function as one electrode of the capacitor 1070. The conductive layer 1210 has a function as the other electrode of the capacitor 1070. The insulating layer 1180 is provided between the conductive layer 1190 and the conductive layer 1210. The conductive layer 1190 is connected to the transistor 1060.

Figure 4B:
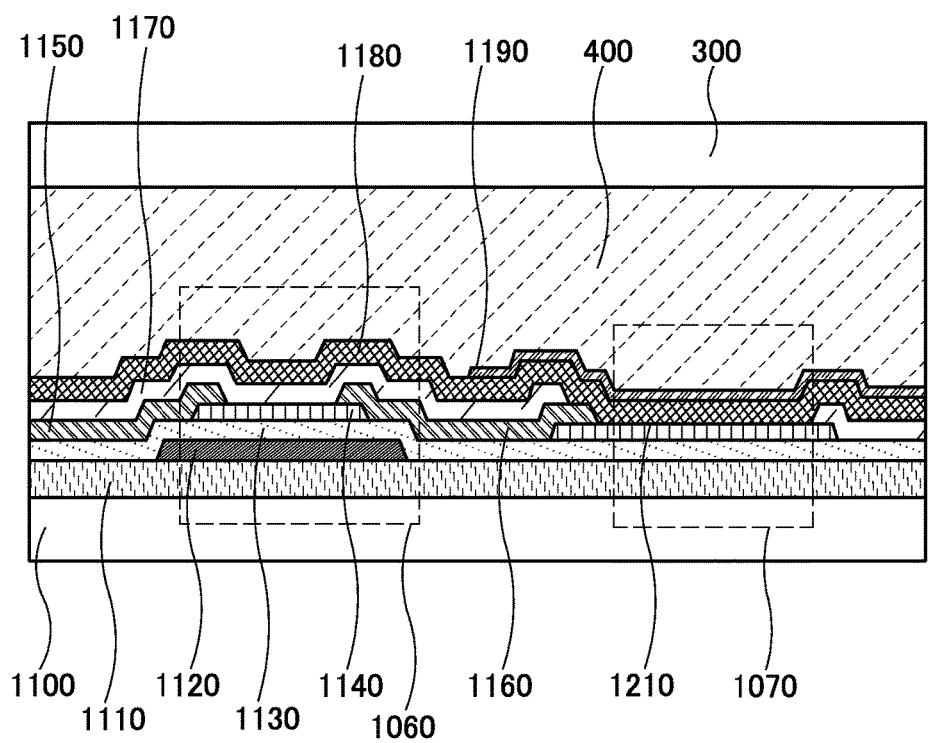
Figure 5A:
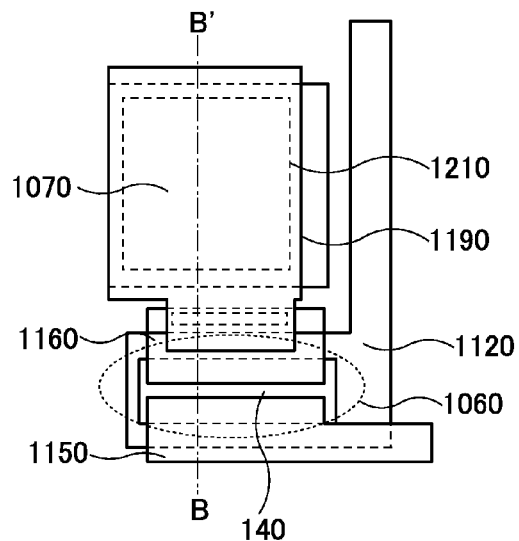
FIGS. 5A to 5D are top views illustrating modes of circuits of one embodiment of the present invention.
Figure 5B:
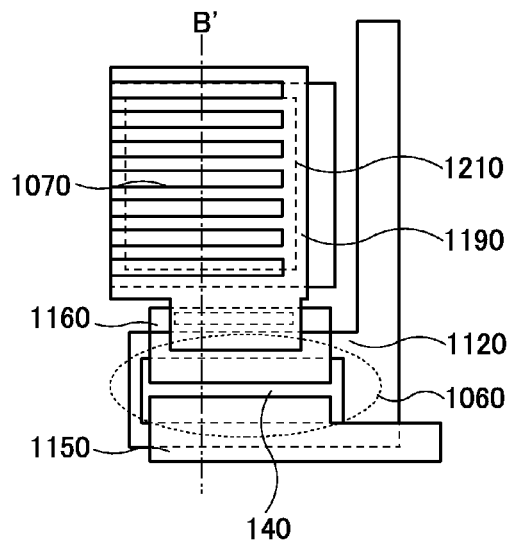
Figure 5C:
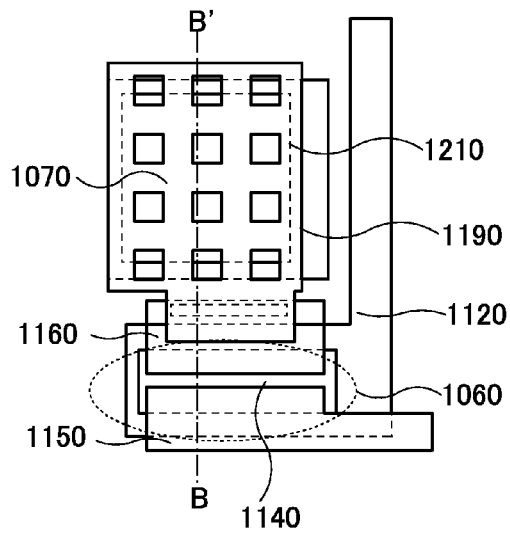
Figure 5D:
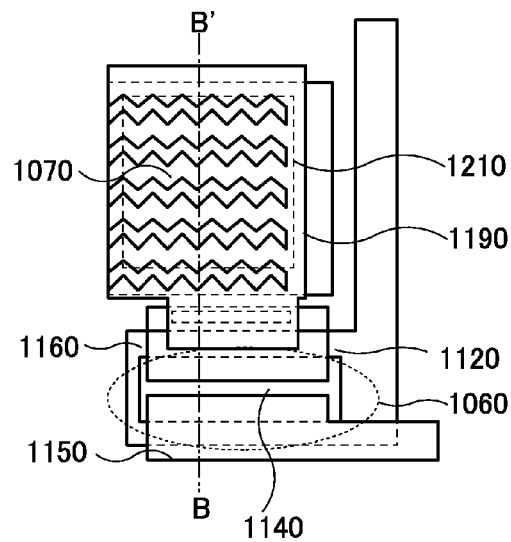

Note that the conductive layer 1160 may be connected to the conductive layer 1210 as illustrated in the cross-sectional view of FIG. 4B.

The transistor 1060 can be formed in the same process as the transistor 60, and the components in the transistor 1060 can be formed using the same material as those in the transistor 60. For example, the insulating layer 110 and the insulating layer 1110 can be formed in the same process.

The capacitor 1070 can be formed in the same process as the capacitor 70, and the components in the capacitor 1070 can be formed using the same material as those in the capacitor 70. For example, the conductive layer 210 and the conductive layer 1210 can be formed in the same process. Alternatively, the conductive layer 1210 and the semiconductor layer 1140 can be formed using the same material. In that case, the conductive layer 1210 is formed by processing a film formed at the same time as the semiconductor layer 1140, and therefore contains elements similar to those in the semiconductor layer 1140. When the film formed at the same time as the semiconductor layer 1140 includes impurities or oxygen vacancies, the film can have conductivity to be the conductive layer 1210. Note that the conductive layer 1210 has conductivity as an example; however, one embodiment of the present invention is not limited to this example and the conductive layer 1210 does not necessarily have conductivity depending on the case or circumstances. In other words, the conductive layer 1210 may have properties similar to those of the semiconductor layer 1140.

The conductive layer 1190 and the conductive layer 1210 have a light-transmitting property, for example; as a result, the whole capacitor 1070 can have a light-transmitting property.

<<Adhesive Layer 400>>

The adhesive layer 400 has a function of attaching the substrates 100 and 300.

An inorganic material, an organic material, a composite material of an inorganic material and an organic material, or the like can be used for the adhesive layer 400.

For example, an organic material such as a light curable adhesive, a reactive curable adhesive, a thermosetting adhesive, and/or an anaerobic adhesive can be used for the adhesive layer 400. Note that each of the adhesives can be used alone or in combination.

The light curable adhesive refers to, for example, an adhesive that is cured by ultraviolet rays, an electron beam, visible light, infrared light, or the like.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, silica, or the like can be used for the adhesive layer 400.

Particularly when a light curable adhesive is used, the material is cured rapidly, leading to shortening of the process time. In addition, involuntary curing of the adhesive due to environment can be prevented because curing starts with light irradiation. Furthermore, curing can be performed at low temperatures to facilitate the control of process environment. From the above reasons, the use of a light curable adhesive shortens the process time and reduces processing costs.

Note that in the case where a light curable adhesive is used for the adhesive layer 400 in FIG. 2B, the use of a light-absorbing or light-reflecting material for a region in contact with the adhesive layer 400 might cause insufficient adhesion because the adhesive layer 400 cannot be irradiated with a sufficient amount of light. In one embodiment of the present invention, however, a light-transmitting material is used for both of the conductive layers 1190 and 1210 of the capacitor 1070 in FIG. 2B, and thus, light passes through the capacitor 1070. As a result, the adhesive layer 400 can be cured sufficiently and the display device can be manufactured at low costs and with high productivity. Moreover, the aforementioned structure enables a narrower bezel (a reduction in the distance between a substrate edge and a display region). Note that in that case, at least part of the capacitor 1070 does not necessarily overlap with the adhesive layer 400. Even when the capacitor 1070 does not overlap with the adhesive layer 400, light can be emitted to the adhesive layer 400 through the capacitor 1070 as long as the capacitor 1070 is in the vicinity of the adhesive layer 400.

Although an example of using a transistor including an oxide semiconductor is shown in this embodiment, one embodiment of the present invention is not limited to this example. Depending on the case or circumstances, a transistor including a semiconductor material that is not an oxide semiconductor may be used in one embodiment of the present invention.

For example, a transistor in which a Group 14 element, a compound semiconductor, an oxide semiconductor, or the like is used for the semiconductor layer can be used. Specifically, a semiconductor containing silicon, a semiconductor containing gallium arsenide, an organic semiconductor, a semiconductor containing silicon carbide, a semiconductor containing germanium, a semiconductor containing silicon germanium, a carbon nanotube, or the like can be used.

For example, single crystal silicon, polysilicon, or amorphous silicon can be used for the semiconductor layer of the transistor.

Note that in this embodiment, the conductive layer 210 and the semiconductor layer 140 are formed using the same material; however, one embodiment of the present invention is not limited to this case. For example, in one embodiment of the present invention, the conductive layer 210 and the semiconductor layer 140 may include different materials depending on the case or circumstances. The same applies to the conductive layer 1210 and the semiconductor layer 1140.

Note that in this embodiment, the conductive layer 1210 and the semiconductor layer 1140 are formed using the same material; however, one embodiment of the present invention is not limited to this case. For example, in one embodiment of the present invention, the conductive layer 1210 and the semiconductor layer 1140 may include different materials depending on the case or circumstances.

Note that in this embodiment, the capacitor 1070 and the capacitor 70 are formed in the same process and the components in the capacitor 1070 are formed using the same material as those in the capacitor 70; however, one embodiment of the present invention is not limited to this example. For example, in one embodiment of the present invention, at least part of the capacitors 1070 and 70 may be formed in different processes depending on the case or circumstances. Also depending on the case or circumstances, for example, at least part of the capacitors 1070 and 70 may contain different materials in one embodiment of the present invention.

Note that the structures, methods, and the like described in this embodiment can be used in appropriate combination with any of the structures, methods, and the like described in the other embodiments.

(Embodiment 2)

In this embodiment, a modification example of the display device shown in Embodiment 1 will be described.

FIGS. 5A to 5D and FIGS. 6A to 6D show top views of the circuit 30.

In the capacitor 1070 in the circuit 30, the conductive layer 1190 having a function as an electrode may have a variety of shapes as illustrated in FIGS. 5A to 5D in order to improve transmittance.

Figure 6A:
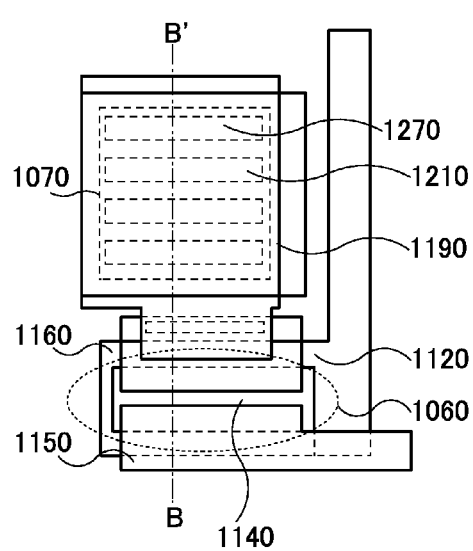
FIGS. 6A to 6D are top views illustrating modes of circuits of one embodiment of the present invention.
Figure 6B:
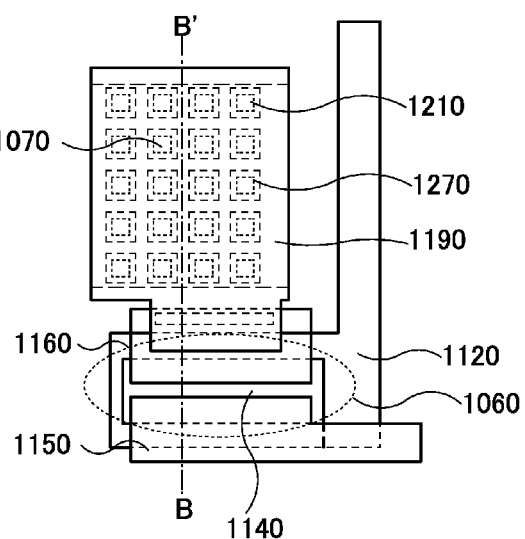

Alternatively, in the capacitor 1070 in the circuit 30, the conductive layer 1210 having a function as an electrode may have a variety of shapes as illustrated in FIGS. 6A and 6B in order to improve transmittance. For example, an opening 1270 may have a square shape or a circular shape.

Figure 6C:
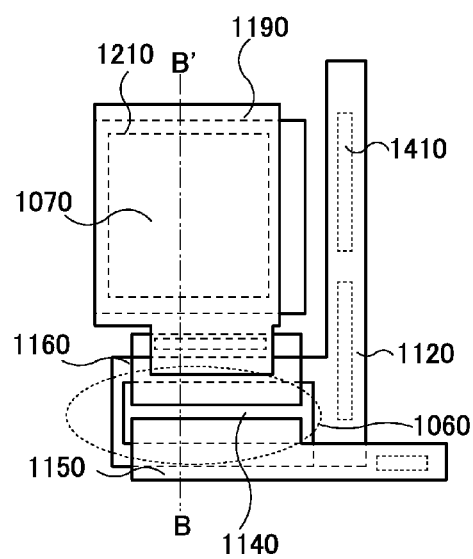
Figure 6D:
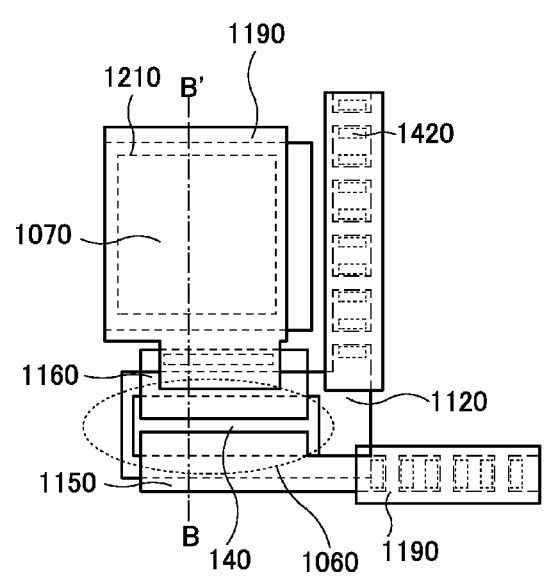

Alternatively, in the circuit 30, not only the shape of the capacitor but also the shapes of the conductive layers 1120 and 1150 may be changed as illustrated in FIGS. 6C and 6D in order to improve transmittance. For example, the conductive layer 1120, the conductive layer 1150, or the like can be provided with an opening 1410, or the conductive layer 1120, the conductive layer 1150, or the like can be provided with an opening 1420 to be connected with the conductive layer 1190. When the openings 1270, 1410, and 1420 are thus provided to overlap with the adhesive layer 400 or in the vicinity of the adhesive layer 400, the adhesive layer 400 can be irradiated with light more easily.

In the aforementioned structure, the electrode of the capacitor 1070 in the circuit 30 may be formed using a light-transmitting material or a metal material.

With the above shape, the light curable adhesive in the circuit 30 can be cured more surely and the display device can be manufactured at low costs and with high productivity.

Note that the structures, methods, and the like described in this embodiment can be used in appropriate combination with any of the structures, methods, and the like described in the other embodiments.

(Embodiment 3)

In this embodiment, another mode of the display device 10, which is one embodiment of the present invention, will be described with reference to FIGS. 7A to 7C.

Figure 7A:
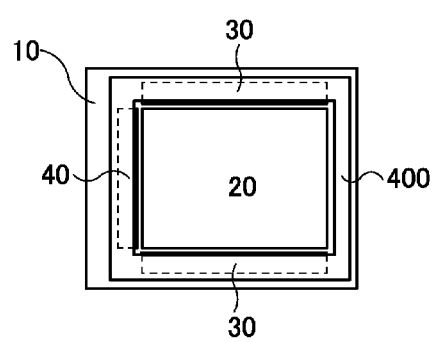
FIGS. 7A to 7C are top views and a cross-sectional view illustrating a display device of one embodiment of the present invention.
Figure 7B:
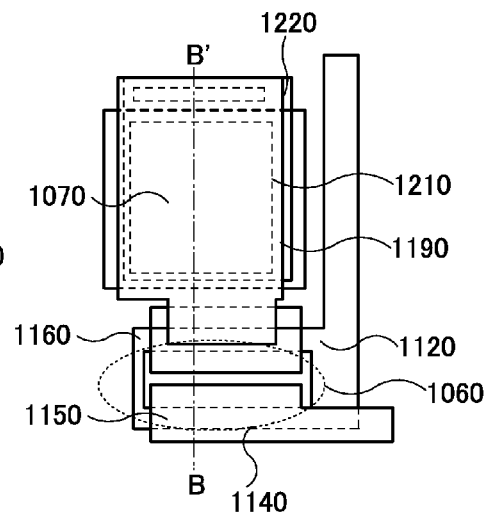
Figure 7C:
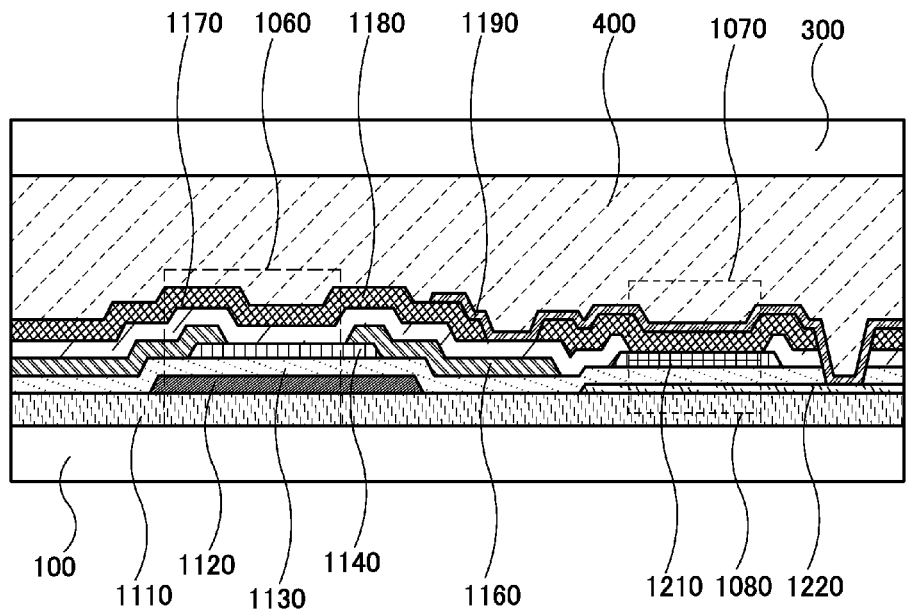

FIG. 7A is a top view of the display device 10, FIG. 7B is a top view of the circuit 30, and FIG. 7C is a cross-sectional view along a dashed-dotted line B-B' in the top view of the circuit 30.

Note that the display device 10 illustrated in FIGS. 7A to 7C has the same structure as the display device 10 illustrated in FIGS. 1A to 1E and FIGS. 2A and 2B except the structure of the capacitor. Thus, the description of the transistor and the like is omitted.

<<Capacitor 1070>>

The capacitor 1070 includes the conductive layer 1190, the insulating layer 1180, and the conductive layer 1210. The conductive layer 1190 has a function as one electrode of the capacitor 1070. The conductive layer 1210 has a function as the other electrode of the capacitor 1070. The insulating layer 1180 is provided between the conductive layer 1190 and the conductive layer 1210. The conductive layer 1190 is connected to the transistor 1060.

<<Capacitor 1080>>

A capacitor 1080 includes a conductive layer 1220, the insulating layer 1130, and the conductive layer 1210. The conductive layer 1220 has a function as one electrode of the capacitor 1080. The conductive layer 1210 has a function as the other electrode of the capacitor 1080. The insulating layer 1130 is provided between the conductive layer 1220 and the conductive layer 1210.

<<Relationship Between the Capacitors 1070 and 1080>>

The capacitors 1070 and 1080 can be provided to overlap with each other. The conductive layer 1210 has a function as the electrodes of the capacitors 1070 and 1080. The conductive layers 1190 and 1220 are electrically connected to each other and can have the same potential.

The conductive layer 1210 is formed at the same time as the semiconductor layer 1140 and is given conductivity after the formation. Such a structure results in a reduction in manufacturing costs.

The conductive layers 1190, 1210, and 1220 each have a light-transmitting property; accordingly, the capacitors 1070 and 1080 each have a light-transmitting property. Note that the conductive layer 1220 may be formed using the same material and in the same process as the conductive layer 1120.

In the case where a light curable adhesive is used for the adhesive layer 400 in FIG. 7C, the use of a light-absorbing or light-reflecting material for a region in contact with the adhesive layer 400 might cause insufficient adhesion because the adhesive layer 400 cannot be irradiated with a sufficient amount of light. In one embodiment of the present invention, however, a light-transmitting material is used for both of the conductive layers 1190 and 1210 of the capacitor 1070, and thus, light passes through the capacitor 1070. In addition, a light-transmitting material is used for both of the conductive layers 1210 and 1220 of the capacitor 1080, and thus, light passes through the capacitor 1080. As a result, the adhesive layer 400 can be cured sufficiently and the display device can be manufactured at low costs and with high productivity.

With the above structure, the light curable adhesive can be cured more surely and the display device can be manufactured at low costs and with high productivity. Furthermore, in the case where the capacitor area cannot be increased in terms of circuit configuration, the capacitance can be increased without an increase in the capacitor area.

Although an example of using a transistor including an oxide semiconductor is shown in this embodiment, one embodiment of the present invention is not limited to this example. Depending on the case or circumstances, a transistor including a semiconductor material that is not an oxide semiconductor may be used in one embodiment of the present invention.

For example, a transistor in which a Group 14 element, a compound semiconductor, an oxide semiconductor, or the like is used for the semiconductor layer can be used. Specifically, a semiconductor containing silicon, a semiconductor containing gallium arsenide, an organic semiconductor, or the like can be used.

For example, single crystal silicon, polysilicon, or amorphous silicon can be used for the semiconductor layer of the transistor.

Note that the electrode of the capacitor is formed using a light-transmitting conductive layer; however, one embodiment of the present invention is not limited to this and a metal material or the like can also be used.

Although the capacitor 1070 in the circuit 30 is shown as an example, the above structure can be used for the capacitor 70 in the circuit 20. As a result, the capacitor area can be reduced, resulting in a reduced pixel area, and further an increased pixel density, so that a high-definition display device can be manufactured. The above structure can also be used for the capacitor in the circuit 40.

Note that this embodiment can be combined with any of the other embodiments in this specification as appropriate.
(Embodiment 4)

In this embodiment, the display devices shown in Embodiments 1 to 3 will be described in detail with reference to FIGS. 8A to 8D.

Figure 8A:
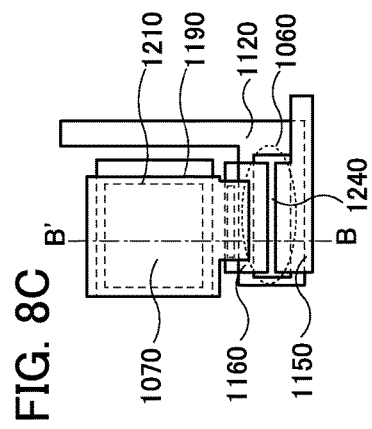
FIGS. 8A to 8D are top views and a cross-sectional view illustrating a display device of one embodiment of the present invention.
Figure 8B:
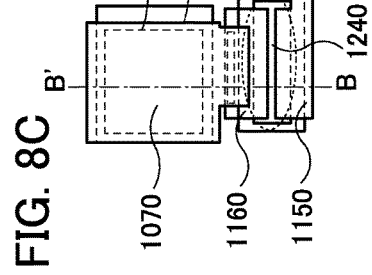
Figure 8C:
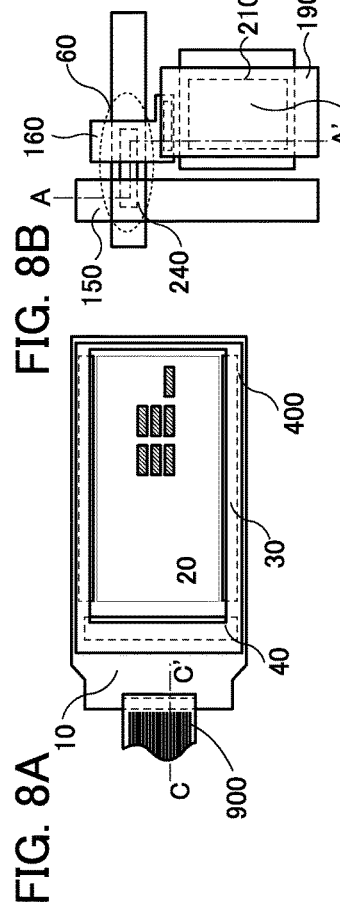

FIGS. 8A to 8D are examples of top views and a cross-sectional view of the display device 10. Note that FIG. 8A illustrates part of a typical structure including the circuit 20 (a display region), the circuit 30 (a gate driver circuit), the circuit 40 (a source driver circuit), and a flexible printed circuit (FPC) 900. FIG. 8B shows an example of a top view of a pixel circuit included in the circuit 20. FIG. 8C shows an example of a top view of part of a circuit included in the circuit 30.

Figure 8D:
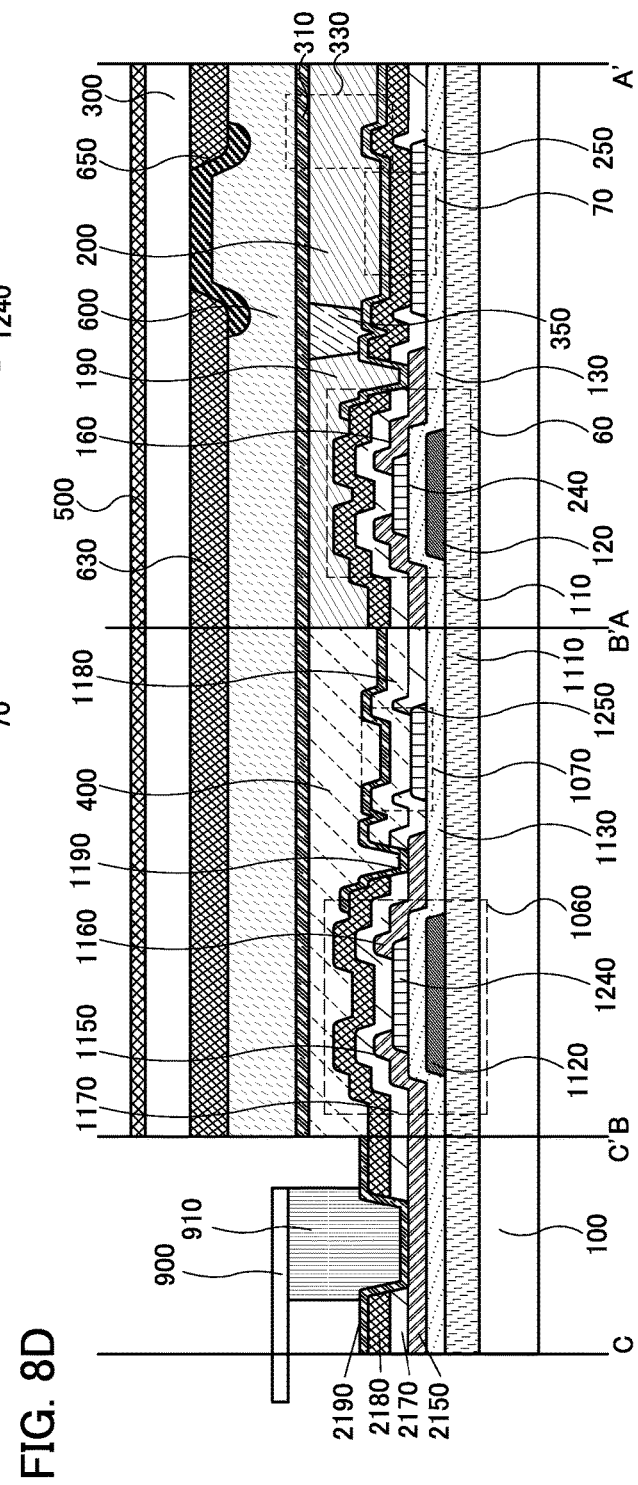

FIG. 8D shows a cross-sectional view along a dashed-dotted line C-C' in FIG. 8A, a cross-sectional view along a dashed-dotted line B-B' in FIG. 8B, and a cross-sectional view along a dashed-dotted line A-A' in FIG. 8C. In a region where the circuit 20 is provided, the substrate 100, the display element (e.g., the liquid crystal element 330 including the liquid crystal layer 200), and the substrate 300 are stacked in this order. In a region where the circuit 30 is provided, the substrates 100 and 300 are attached to each other with the adhesive layer 400. FIG. 8D illustrates an example in which a touch sensor 500 overlaps with the substrate 300; however, the touch sensor 500 is not necessarily provided.

<<Substrates 100 and 300>>

There is no particular limitation on a material and the like of the substrates 100 and 300 as long as the material has heat resistance high enough to withstand at least heat treatment performed later. A material with a high light-transmitting property is preferably used.

For the substrate 100, an organic material, an inorganic material, a composite material of an organic material and an inorganic material, or the like can be used. For example, an inorganic material such as glass, a ceramic, or a metal can be used for the substrate 100.

Specifically, non-alkali glass, soda-lime glass, potash glass, crystal glass, or the like can be used for the substrate 100. An inorganic oxide film, an inorganic nitride film, an inorganic oxynitride film, or the like can be used for the substrate 100. Silicon oxide, silicon nitride, silicon oxynitride, alumina, stainless steel, aluminum, or the like can be used for the substrate 100.

For example, an organic material such as a resin, a resin film, or plastic can be used for the substrate 100. Specifically, a resin film or resin plate of polyester, polyolefin, polyamide, polyimide, polycarbonate, an acrylic resin, or the like can be used for the substrate 100.

For example, a composite material such as a resin film to which a metal plate, a thin glass plate, or a film of an inorganic material is attached can be used for the substrate 100. For example, a composite material formed by dispersing a fibrous or particulate metal, glass, inorganic material, or the like into a resin film can be used for the substrate 100. For example, a composite material formed by dispersing a fibrous or particulate resin, organic material, or the like into an inorganic material can be used for the substrate 100.

Furthermore, a single-layer material or a stacked-layer material in which a plurality of layers are stacked can be used for the substrate 100. For example, a stacked-layer material in which a base, an insulating film that prevents diffusion of impurities contained in the base, and the like are stacked can be used for the substrate 100. Specifically, a stacked-layer material in which glass and one or a plurality of films that prevent diffusion of impurities contained in the glass and that are selected from a silicon oxide layer, a silicon nitride layer, a silicon oxynitride layer, and the like are stacked can be used for the substrate 100. Alternatively, a stacked-layer material in which a resin and a film for preventing diffusion of impurities that penetrate the resin, such as a silicon oxide film, a silicon nitride film, and a silicon oxynitride film are stacked can be used for the substrate 100.

The above-described substrate that can be used as the substrate 100 can be used as the substrate 300 as well.

<<Insulating Layers 110 and 1100>>

Note that the insulating layers 110 and 1100 having a function as a base film are formed using silicon oxide, silicon oxynitride, silicon nitride, silicon nitride oxide, gallium oxide, hafnium oxide, yttrium oxide, aluminum oxide, aluminum oxynitride, or the like. Note that when silicon nitride, gallium oxide, hafnium oxide, yttrium oxide, aluminum oxide, or the like is used as a material for the insulating layer 110, it is possible to suppress diffusion of impurities such as alkali metal, water, and hydrogen into the oxide semiconductor layer 240 from the substrate 100. The insulating layer 110 is formed over the substrate 100. The insulating layer 110 is not necessarily provided. The insulating layer 1110 is formed using a film having the same composition as the insulating layer 110.

<<Conductive Layers 120 and 1120>>

The conductive layers 120 and 1120 having a function as a gate electrode are formed using a metal element selected from aluminum, chromium, copper, tantalum, titanium, molybdenum, nickel, iron, cobalt, and tungsten; an alloy containing any of these metal elements as a component; an alloy containing any of these metal elements in combination; or the like. Further, one or more metal elements selected from manganese and zirconium may be used. The conductive layer 120 may have a single-layer structure or a layered structure of two or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum, tungsten, molybdenum, chromium, neodymium, and scandium may be used. The conductive layer 1120 can be formed using a film having the same composition as the conductive layer 120.

<<Insulating Layers 130 and 1130>>

The insulating layers 130 and 1130 have a function as a gate insulating film. The insulating layer 130 can be formed using, for example, an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 130 may be a stack of any of the above materials. The insulating layer 130 may contain lanthanum (La), nitrogen, or zirconium (Zr) as an impurity. The insulating layer 1130 is formed at the same time as the insulating layer 130 and is formed using a film having the same composition as the insulating layer 130.

<<Oxide Semiconductor Layers 240 and 1240>>

The oxide semiconductor layers 240 and 1240 are formed using a metal oxide containing at least In or Zn; typically, an In—Ga oxide, an In—Zn oxide, or In-M-Zn oxide (M is Al, Ga, Y, Zr, La, Ce, or Nd), or the like is used. Note that the oxide semiconductor layer 1240 is formed at the same time as the oxide semiconductor layer 240 and is formed using a film having the same composition as the oxide semiconductor layer 240.

When the oxide semiconductor layers 240 and 1240 are formed using an In-M-Zn oxide, the atomic ratio of In to M when the summation of In and M is assumed to be 100 atomic % is preferably as follows: the proportion of In is higher than 25 atomic % and the proportion of M is lower than 75 atomic %; further preferably, the proportion of In is higher than 34 atomic % and the proportion of M is lower than 66 atomic %.

The energy gap of each of the oxide semiconductor layers 240 and 1240 is 2 eV or more, preferably 2.5 eV or more, and further preferably 3 eV or more. With the use of an oxide semiconductor having such a wide energy gap, the off-state current of the transistor 60 can be reduced.

The thickness of each of the oxide semiconductor layers 240 and 1240 ranges from 3 nm to 200 nm, preferably from 3 nm to 100 nm, and further preferably from 3 nm to 50 nm.

In the case where the oxide semiconductor layers 240 and 1240 are formed using an In-M-Zn oxide (M is Al, Ga, Y, Zr, La, Ce, or Nd), it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=3:1:2, and In:M:Zn=4:1:4.1 are preferable. Note that the atomic ratio of metal elements in the formed oxide semiconductor layers 240 and 1240 varies from the above atomic ratio of metal elements of the sputtering target within a range of ±40% as an error. Note that a c-axis aligned crystalline oxide semiconductor (CAAC-OS) film and a microcrystalline oxide semiconductor film that are described later can be formed using a target including an In—Ga—Zn oxide, preferably a polycrystalline target including an In—Ga—Zn oxide.

Hydrogen contained in the oxide semiconductor reacts with oxygen bonded to a metal atom to be water, and also causes oxygen vacancies in a lattice from which oxygen is released (or a portion from which oxygen is released). Due to entry of hydrogen into the oxygen vacancies, an electron serving as a carrier is generated. Further, in some cases, bonding of part of hydrogen to oxygen bonded to a metal atom causes generation of an electron serving as a carrier. Thus, a transistor including an oxide semiconductor which contains hydrogen is likely to be normally on.

Accordingly, it is preferable that hydrogen be reduced as much as possible as well as the oxygen vacancies in the oxide semiconductor layers 240 and 1240. Specifically, in the oxide semiconductor layers 240 and 1240, the concentration of hydrogen which is measured by secondary ion mass spectrometry (SIMS) is set to lower than or equal to $5 \times 10^{19}$ atoms/cm$^3$, preferably lower than or equal to $1 \times 10^{19}$ atoms/cm$^3$, further preferably lower than or equal to $5 \times 10^{18}$ atoms/cm$^3$, still further preferably lower than or equal to $1 \times 10^{18}$ atoms/cm$^3$, yet still further preferably lower than or equal to $5 \times 10^{17}$ atoms/cm$^3$, and still more preferably lower than or equal to $1 \times 10^{16}$ atoms/cm$^3$. As a result, the transistor 60 has a positive threshold voltage (also referred to as normally-off characteristics).

When silicon or carbon which is one of the elements belonging to Group 14 is contained in the oxide semiconductor layers 240 and 1240, oxygen vacancies are increased in the oxide semiconductor layers 240 and 1240, and the oxide semiconductor layers 240 and 1240 have n-type conductivity. Thus, the concentration of silicon or carbon (the concentration is measured by SIMS) in the oxide semiconductor layers 240 and 1240 is lower than or equal to $2 \times 10^{18}$ atoms/cm$^3$, preferably lower than or equal to $2 \times 10^{17}$ atoms/cm$^3$. As a result, the transistor 60 has a positive threshold voltage (also referred to as normally-off characteristics).

Further, the concentration of alkali metal or alkaline earth metal in the oxide semiconductor layers 240 and 1240, which is measured by SIMS, is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor layers 240 and 1240. As a result, the transistor 60 has a positive threshold voltage (also referred to as normally-off characteristics).

Further, when nitrogen is contained in the oxide semiconductor layers 240 and 1240, electrons serving as carriers are generated to increase the carrier density, so that the oxide semiconductor layers 240 and 1240 easily have n-type conductivity. Thus, the transistor tends to have normally-on characteristics. For this reason, nitrogen in the oxide semiconductor layers 240 and 1240 is preferably reduced as much as possible; for example, the concentration of nitrogen which is measured by SIMS is preferably set to lower than or equal to $5 \times 10^{18}$ atoms/cm$^3$.

When impurities in the oxide semiconductor layers 240 and 1240 are reduced, the carrier density of the oxide semiconductor layers 240 and 1240 can be lowered. Each of the oxide semiconductor layers 240 and 1240 has a carrier density of $1 \times 10^{15}$/cm$^3$ or less, preferably $1 \times 10^{13}$/cm$^3$ or less, further preferably $8 \times 10^{11}$/cm$^3$ or less, still further preferably $1 \times 10^{11}$/cm$^3$ or less, and yet still further preferably $1 \times 10^{10}$/cm$^3$ or less and $1 \times 10^{-9}$/cm$^3$ or more.

Figure 9A:
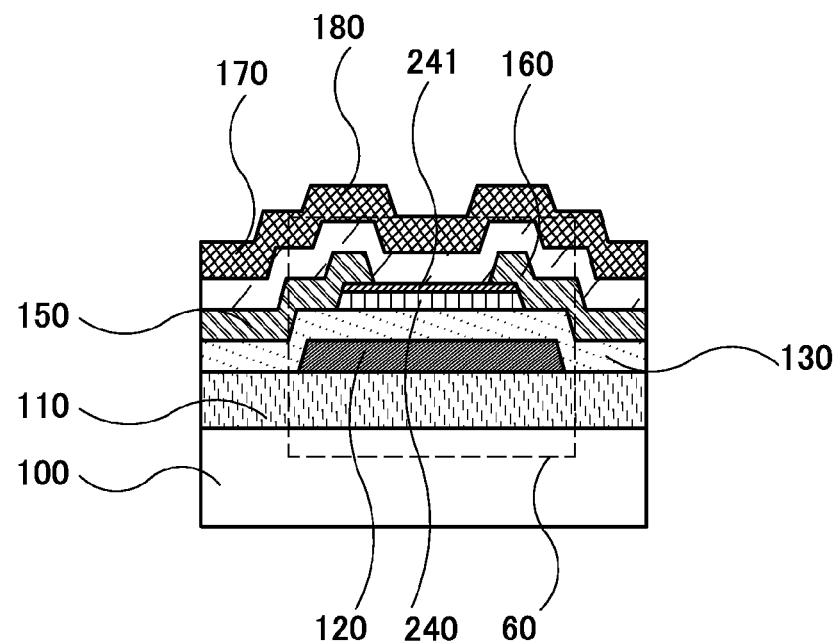
FIGS. 9A and 9B are cross-sectional views each illustrating a transistor of one embodiment of the present invention.
Figure 9B:
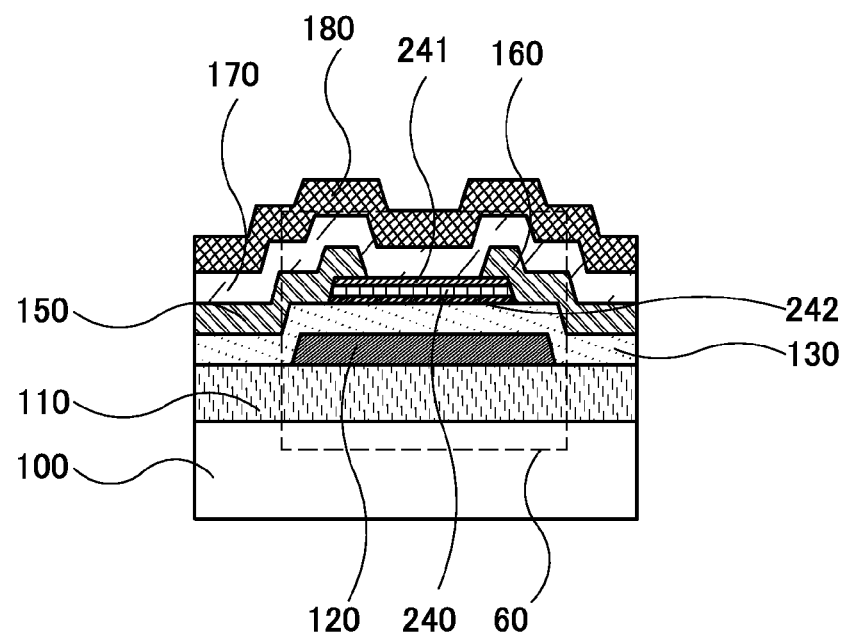

Note that in the oxide semiconductor layers 240 and 1240, a plurality of oxide semiconductor films that differ in the atomic ratio of metal elements may be stacked. For example, as illustrated in FIG. 9A, the oxide semiconductor layer 240 and an oxide semiconductor layer 241 may be stacked in order over the insulating layer 130. Alternatively, as illustrated in FIG. 9B, an oxide semiconductor layer 242, the oxide semiconductor layer 240, and the oxide semiconductor layer 241 may be stacked in order over the insulating layer 130. The oxide semiconductor layers 241 and 242 differ from the oxide semiconductor layer 240 in the atomic ratio of metal elements. The oxide semiconductor layer 1240 may also have the same structure.

When an oxide semiconductor having a low impurity concentration and a low density of defect states is used for the oxide semiconductor layer 240, the transistor can have more excellent electrical characteristics. Here, the state in which impurity concentration is low and the density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, the transistor whose channel region is formed in the oxide semiconductor layer 240 including the oxide semiconductor is likely to have a positive threshold voltage (also referred to as normally-off characteristics). A highly purified intrinsic or substantially highly purified intrinsic oxide semiconductor has a low density of defect states and accordingly has a low density of trap states in some cases. The transistor including the oxide semiconductor layer 240 having the highly purified intrinsic or substantially highly purified intrinsic oxide semiconductor has an extremely low off-state current; the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V. Thus, the transistor whose channel region is formed in the oxide semiconductor layer 240 has a small variation in electrical characteristics and high reliability in some cases.

Since the oxide semiconductor layer 240 can be deposited by sputtering, the transistor using the oxide semiconductor can also be used in a large-area display device.

Note that instead of the oxide semiconductor layer 240, a semiconductor layer including silicon or silicon germanium may be formed. The semiconductor layer including silicon or silicon germanium can have an amorphous structure, a polycrystalline structure, or a single crystal structure, as appropriate.

<<Conductive Layers 150, 160, 1150, 1160, and 2150>>

The pair of conductive layers 150 and 160 have a function as a source electrode and a drain electrode. The pair of conductive layers 150 and 160, the pair of conductive layers 1150 and 1160, and the conductive layer 2150 are formed using a metal element selected from aluminum, chromium, copper, tantalum, titanium, molybdenum, nickel, iron, cobalt, and tungsten; an alloy containing any of these metal elements as a component; an alloy containing any of these metal elements in combination; or the like. Further, one or more metal elements selected from manganese and zirconium may be used. The conductive layers 150, 160, 1150, 1160, and 2150 may each have a single-layer structure or a layered structure of two or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum, tungsten, molybdenum, chromium, neodymium, and scandium may be used. The pair of conductive layers 1150 and 1160, and the conductive layer 2150 are formed using a film having the same composition as the conductive layers 150 and 160.

<<Insulating Layers 170, 1170, and 2170>>

The insulating layer 170 has a function of protecting the channel region of the transistor. The insulating layer 170 is formed using an oxide insulating film such as silicon oxide, silicon oxynitride, aluminum oxide, aluminum oxynitride, gallium oxide, gallium oxynitride, yttrium oxide, yttrium oxynitride, hafnium oxide, or hafnium oxynitride, or a nitride insulating film such as silicon nitride or aluminum nitride. The insulating layer 170 can have a single-layer structure or a stacked-layer structure. The insulating layers 1170 and 2170 are formed using a film having the same composition as the insulating layer 170.

The insulating layer 170 is preferably formed using an oxide insulating film containing more oxygen than that in the stoichiometric composition. Part of oxygen is released by heating from the oxide insulating film containing more oxygen than that in the stoichiometric composition. The oxide insulating film containing more oxygen than that in the stoichiometric composition is an oxide insulating film of which the amount of released oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis in which heat treatment is performed such that a temperature of a film surface is higher than or equal to 100° C. and lower than or equal to 700° C. or higher than or equal to 100° C. and lower than or equal to 500° C. By the heat treatment, oxygen contained in the insulating layer 170 can be transferred to the oxide semiconductor layer 240, so that the amount of oxygen vacancies in the oxide semiconductor layer 240 can be reduced.

<<Insulating Layers 180, 1180, and 2180>>

When an insulating film having a blocking effect against oxygen, hydrogen, water, and the like is provided as the insulating layer 180, it is possible to prevent outward diffusion of oxygen from the oxide semiconductor layer 240 and entry of hydrogen, water, or the like into the oxide semiconductor layer 240 from the outside. The insulating layer 180 can be formed using, for example, an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials. The insulating layer 180 may contain lanthanum (La), nitrogen, or zirconium (Zr) as an impurity. The insulating layers 1180 and 2180 are formed using a film having the same composition as the insulating layer 180.

<<Conductive Layers 190, 1190, and 2190>>

The conductive layer 190 is formed using a conductive film that transmits visible light. For example, a material including one of indium (In), zinc (Zn), and tin (Sn) can be used for the conductive film that transmits visible light. Typically, a conductive oxide such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide can be used. The conductive layers 1190 and 2190 are formed using a film having the same composition as the conductive layer 190.

<<Conductive Layers 250 and 1250>>

The conductive layer 250 as well as the oxide semiconductor layer 240 is formed over the insulating layer 130. The conductive layer 1250 as well as the oxide semiconductor layer 1240 is formed over the insulating layer 1130. The conductive layers 250 and 1250 can be formed using the same material at the same time.

When the transistor 60 includes the oxide semiconductor layer 240, the conductive layer 250 can be formed over the insulating layer 130 using the same material as the semiconductor layer 240. In that case, the conductive layer 250 is formed by processing a film formed at the same time as the oxide semiconductor layer 240, and therefore contains elements similar to those in the oxide semiconductor layer 240. The conductive layer 250 has a crystal structure similar to or different from that of the oxide semiconductor layer 240. When the film formed at the same time as the oxide semiconductor layer 240 includes impurities or oxygen vacancies, the film can have conductivity to be the conductive layer 250. Typical examples of the impurities included in the conductive layer 250 are a rare gas, hydrogen, boron, nitrogen, fluorine, aluminum, and phosphorus. Typical examples of the rare gas include helium, neon, argon, krypton, and xenon. Note that the conductive layer 250 has conductivity as an example; however, one embodiment of the present invention is not limited to this example and the conductive layer 250 does not necessarily have conductivity depending on the case or circumstances. In other words, the conductive layer 250 may have properties similar to those of the oxide semiconductor layer 240.

Although the oxide semiconductor layer 240 and the conductive layer 250 are formed over the insulating layer 130 in the above manner, they have different impurity concentrations. Specifically, the impurity concentration of the conductive layer 250 is higher than that of the oxide semiconductor layer 240. For example, in the oxide semiconductor layer 240, the hydrogen concentration measured by secondary ion mass spectrometry is lower than or equal to $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$, and yet still further preferably lower than or equal to $1 \times 10^{16}$ atoms/cm$^3$. In contrast, the hydrogen concentration in the conductive layer 250 measured by secondary ion mass spectrometry is higher than or equal to $8 \times 10^{19}$ atoms/cm$^3$, preferably higher than or equal to $1 \times 10^{20}$ atoms/cm$^3$, and further preferably higher than or equal to $5 \times 10^{20}$ atoms/cm$^3$. In addition, the hydrogen concentration in the conductive layer 250 is greater than or equal to 2 times or greater than or equal to 10 times that in the oxide semiconductor layer 240.

The conductive layer 250 has lower resistivity than the oxide semiconductor layer 240. The resistivity of the conductive layer 250 is preferably greater than or equal to $1 \times 10^{-8}$ times and less than $1 \times 10^{-1}$ times that of the oxide semiconductor layer 240. The resistivity of the conductive layer 250 is typically greater than or equal to $1 \times 10^{-3}$ $\Omega$cm and less than $1 \times 10^4$ $\Omega$cm, or greater than or equal to $1 \times 10^{-3}$ $\Omega$cm and less than $1 \times 10^{-1}$ $\Omega$cm.

When an oxide semiconductor film formed at the same time as the oxide semiconductor layer 240 is exposed to plasma, the oxide semiconductor film is damaged and oxygen vacancies can be generated. For example, when a film is formed over the oxide semiconductor film by a plasma CVD method or a sputtering method, the oxide semiconductor film is exposed to plasma and oxygen vacancies are generated. Alternatively, when the oxide semiconductor film is exposed to plasma in etching treatment for formation of an opening in the insulating layer 170, oxygen vacancies are generated. Alternatively, when the oxide semiconductor film is exposed to plasma of a mixed gas of oxygen and hydrogen, hydrogen, a rare gas, ammonia, and the like, oxygen vacancies are generated. Alternatively, when impurities are added to the oxide semiconductor film, oxygen vacancies can be formed while the impurities are added to the oxide semiconductor film. The impurities can be added by an ion doping method, an ion implantation method, a plasma treatment method, and the like. In the plasma treatment method, plasma is generated in a gas atmosphere containing the impurities to be added, and ions of the impurities accelerated by plasma treatment are made to collide with the oxide semiconductor film, whereby oxygen vacancies can be formed in the oxide semiconductor film.

When an impurity, e.g., hydrogen is contained in the oxide semiconductor film in which oxygen vacancies are generated by addition of impurity elements, hydrogen enters an oxygen vacant site and forms a donor level in the vicinity of the conduction band. As a result, the oxide semiconductor film has increased conductivity to be a conductor. An oxide semiconductor film that has become a conductor can be referred to as an oxide conductor film. That is, it can be said that the oxide semiconductor layer 240 is formed of an oxide semiconductor and the conductive layer 250 is formed of an oxide conductor film. It can also be said that the conductive layer 250 is formed of an oxide semiconductor film having high conductivity or a metal oxide film having high conductivity.

Note that the insulating layer 180 preferably contains hydrogen. Since the conductive layer 250 is in contact with the insulating layer 170, hydrogen contained in the insulating layer 180 can be diffused into the oxide semiconductor film formed at the same time as the oxide semiconductor layer 240. As a result, impurities can be added to the oxide semiconductor film formed at the same time as the oxide semiconductor layer 240.

Furthermore, the insulating layer 170 is preferably formed using an oxide insulating film containing more oxygen than that in the stoichiometric composition, and the insulating layer 180 is preferably formed using an insulating film containing hydrogen. When oxygen contained in the insulating layer 170 is transferred to the oxide semiconductor layer 240 of the transistor 60, the amount of oxygen vacancies in the oxide semiconductor layer 240 can be reduced and a change in the electrical characteristics of the transistor 60 can be reduced. In addition, hydrogen contained in the insulating layer 180 is transferred to the conductive layer 250 to increase the conductivity of the conductive layer 250.

In the above manner, the conductive layer 250 can be formed at the same time as the oxide semiconductor layer 240 and is given conductivity after the formation. Such a structure results in a reduction in manufacturing costs.

The conductive layer 250 is formed at the same time as the oxide semiconductor layer 240 and is given conductivity after the formation. Such a structure results in a reduction in manufacturing costs.

Conductivity can be given to the conductive layers 250 and 1250 in the same way.

<<Insulating Layer 600>>

An insulating layer 600 has a function as a planarization film. The insulating layer 600 is formed using a heat-resistant organic material, such as a polyimide resin, an acrylic resin, a polyimide amide resin, a benzocyclobutene resin, a polyamide resin, or an epoxy resin. Note that the insulating layer 600 may be formed by stacking a plurality of insulating films formed using any of these materials. The insulating layer 600 is not necessarily provided.

<<Light-Blocking Layer 630>>

A light-blocking material can be used for the light-blocking layer 630. A resin in which a pigment is dispersed, a resin containing a dye, or an inorganic film such as a black chromium film can be used for the light-blocking layer 630. Carbon black, an inorganic oxide, a composite oxide containing a solid solution of a plurality of inorganic oxides, or the like can be used for the light-blocking layer 630.

<<Coloring Layer 650>>

The coloring layer 650 transmits light in a specific wavelength range. For example, a color filter that transmits light in a specific wavelength range, such as red, green, blue, or yellow light, can be used. Each coloring layer is formed in a desired position with any of various materials by a printing method, an inkjet method, an etching method using a photolithography method, or the like. In a white pixel, a resin such as a transparent resin or a white resin may be overlapped with the light-emitting element.

<<Spacer 350>>

An insulating material can be used for a spacer 350. For example, an inorganic material, an organic material, or a stacked-layer material of an inorganic material and an organic material can be used. Specifically, a film containing silicon oxide, silicon nitride, or the like, acrylic, polyimide, a photosensitive resin, or the like can be used.

<<FPC 900>>

An FPC 900 is electrically connected to the conductive layer 2190 with an anisotropic conductive film 910 provided therebetween. The conductive layer 2190 can be formed in the step of forming the electrode layer of the transistor 1060 and the like. The FPC 900 can supply an image signal and the like to the circuit 30 (driver circuit) including the transistor 1060, the capacitor 1070, and the like.

<Modification Example of Transistor 1060>

A modification example of the transistor 1060 will be described with reference to FIGS. 10A to 10C. The transistor illustrated in FIGS. 10A to 10C has a dual-gate structure.

Figure 10A:
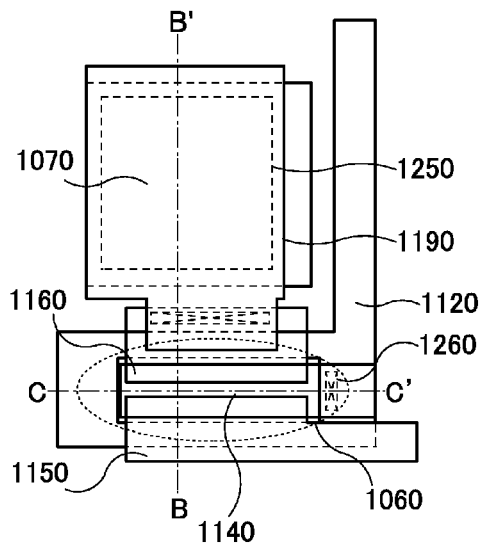
FIGS. 10A to 10C are a top view and cross-sectional views illustrating a display device of one embodiment of the present invention.
Figure 10C:
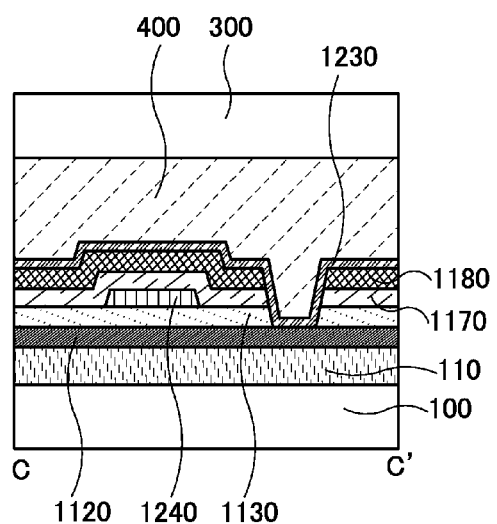
Figure 10B:
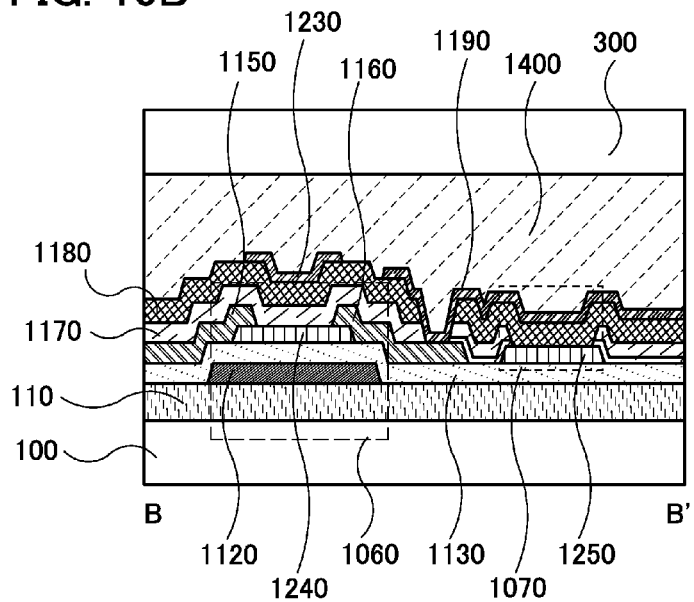

FIGS. 10A to 10C are a top view and cross-sectional views of the transistor 1060 included in a semiconductor device. FIG. 10A is a top view of the transistor 1060, FIG. 10B is a cross-sectional view along a dashed-dotted line B-B' of FIG. 10A, and FIG. 10C is a cross-sectional view along a dashed-dotted line C-C' of FIG. 10A. Note that in FIG. 10A, the substrate 100, the insulating layer 110, the insulating layer 1130, the insulating layer 1170, the insulating layer 1180, the adhesive layer 400, and the like are not illustrated for the sake of clarity.

The transistor 1060 illustrated in FIGS. 10A to 10C includes the conductive layer 1120 that is over the insulating layer 110 and has a function as a gate electrode, the insulating layer 1130 that is over the conductive layer 1120 and has a function as a gate insulating film, the oxide semiconductor layer 1240 that overlaps with the conductive layer 1120 with the insulating layer 1130 provided therebetween, the pair of conductive layers 1150 and 1160 in contact with the oxide semiconductor layer 1240, the insulating layer 1170 over the oxide semiconductor layer 1240 and the pair of conductive layers 1150 and 1160, the insulating layer 1180 over the insulating layer 1170, and a conductive layer 1230 that is over the insulating layer 1180 and has a function as a back-gate electrode. The conductive layer 1120 may be connected to the conductive layer 1230 through an opening 1260 formed in the insulating layers 1130, 1170, and 1180.

<<Conductive Layer 1230>>

The conductive layer 1230 is formed using a conductive film that transmits visible light or a conductive film that reflects visible light. For example, a material including one of indium (In), zinc (Zn), and tin (Sn) can be used for the conductive film that transmits visible light. Typically, a conductive oxide such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide can be used. For the conductive film that reflects visible light, a material containing aluminum or silver can be used, for example.

Note that when a side surface of the oxide semiconductor layer 1240 faces the conductive layer 1230 in the channel width direction as shown in FIG. 10C, carriers flow not only at the interface between the insulating layer 1170 and the semiconductor layer 1140 and at the interface between the insulating layer 1130 and the semiconductor layer 1140 but also in the semiconductor layer 1140. Therefore, the amount of transfer of carriers in the transistor 1060 is increased. As a result, the on-state current and field-effect mobility of the transistor 1060 are increased. The electric field of the conductive layer 1230 affects the side surface or an end portion including the side surface and its vicinity of the semiconductor layer 1140; thus, generation of a parasitic channel at the side surface or the end portion of the semiconductor layer 1140 can be suppressed.

The transistor illustrated in FIGS. 10A to 10C has higher field-effect mobility and higher on-state current than the transistor illustrated in FIGS. 2A and 2B. Therefore, by using the transistor with the structure illustrated in FIGS. 10A to 10C as the transistor provided in the circuit 30 (gate driver), a driver circuit portion capable of high-speed operation can be obtained. Furthermore, the area occupied by the circuit 30 can be reduced, and the area of the circuit 20 (pixel portion) can be increased.

The transistor illustrated in FIGS. 10A to 10C can also be used as the transistor 60 in the circuit 20. By providing the transistor having a high on-state current in the circuit 20 (pixel portion), signal delay in wirings can be reduced and display defects such as display unevenness can be suppressed even though the number of wirings is increased in a large-sized display device or a high-resolution display device.

Note that all of transistors 1060 included in the circuit (gate driver and the like) may have the same structure or may have two or more kinds of structures. All of a plurality of transistors 60 included in the circuit (pixel portion) may have the same structure, or may have two or more kinds of structures.

Although an example of using a transistor including an oxide semiconductor is shown in this embodiment, one embodiment of the present invention is not limited to this example. Depending on the case or circumstances, a transistor including a semiconductor material that is not an oxide semiconductor may be used in one embodiment of the present invention.

For example, a transistor in which a Group 14 element, a compound semiconductor, an oxide semiconductor, or the like is used for the semiconductor layer can be used. Specifically, a semiconductor containing silicon, a semiconductor containing gallium arsenide, an organic semiconductor, or the like can be used.

For example, single crystal silicon, polysilicon, or amorphous silicon can be used for the semiconductor layer of the transistor.

Note that this embodiment can be combined with any of the other embodiments in this specification as appropriate.

(Embodiment 5)

A structure of the oxide semiconductor film will be described below.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology that reflects a surface over which the CAAC-OS film is formed (also referred to as a formation surface) or a top surface of the CAAC-OS film, and is provided parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

The CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around $31°$. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of $2\theta$ may also be observed at around $36°$, in addition to the peak of $2\theta$ at around $31°$. The peak of $2\theta$ at around $36°$ indicates that a crystal having no c-axis alignment is included in part of the CAAC-OS film. It is preferable that in the CAAC-OS film, a peak of $2\theta$ appear at around $31°$ and a peak of $2\theta$ not appear at around $36°$.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image for example, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different crystal parts in the nc-OS film; thus, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm corresponds to the a-b plane of the $InGaZnO_4$ crystal, focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single-crystal oxide semiconductor film having the same composition as the oxide semiconductor film. For example, the density of an a-like OS film is higher than or equal to 78.6% and lower than 92.3% of that of the single-crystal oxide semiconductor film. In addition, for example, the density of an nc-OS film or a CAAC-OS film is higher than or equal to 92.3% and lower than 100% of that of the single-crystal oxide semiconductor film. Note that it is difficult to form an oxide semiconductor film whose density is lower than 78% of that of the single-crystal oxide semiconductor film.

Specific examples of the above are described. For example, in the case of an oxide semiconductor film with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor film with an atomic ratio of In:Ga:Zn=1:1:1, the density of an a-like OS film is higher than or equal to 5.0 $g/cm^3$ and lower than 5.9 $g/cm^3$. In addition, for example, in the case of the oxide semiconductor film with an atomic ratio of In:Ga:Zn=1:1:1, the density of an nc-OS film or a CAAC-OS film is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate the density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including, for example, two or more films of an amorphous oxide semiconductor film, an a-like OS film, a microcrystalline oxide semiconductor film, and a CAAC-OS film.

Note that this embodiment can be combined with any of the other embodiments in this specification as appropriate.

(Embodiment 6)

In this embodiment, a structure example of a display device of one embodiment of the present invention will be described with reference to FIGS. 11A to 11C.

[Structure Example]

Figure 11A:
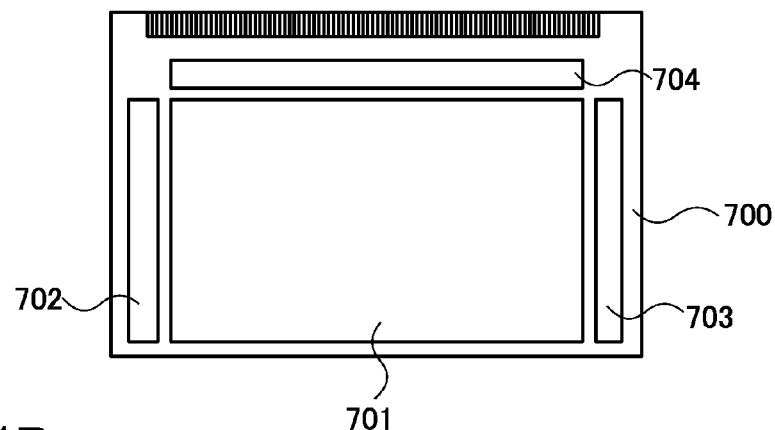
FIGS. 11A to 11C are a top view and circuit diagrams illustrating a display device of one embodiment of the present invention.

FIG. 11A is a top view of the display device of one embodiment of the present invention. FIG. 11B is a circuit diagram illustrating a pixel circuit that can be used in the case where a liquid crystal element is used in a pixel in the display device of one embodiment of the present invention. FIG. 11C is a circuit diagram illustrating a pixel circuit that can be used in the case where an organic EL element is used in a pixel in the display device of one embodiment of the present invention.

The transistor in the pixel portion can be formed in accordance with the above embodiments. The transistor can be easily formed as an n-channel transistor, and thus part of a driver circuit that can be formed using an n-channel transistor is formed over the same substrate as the transistor of the pixel portion. With the use of any of the transistors described in the above embodiments for the pixel portion or the driver circuit in this manner, a highly reliable display device can be provided.

FIG. 11A illustrates an example of a top view of an active matrix display device. A pixel portion 701, a scan line driver circuit 702, a scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the scan line driver circuit 702 and the scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 11A, the scan line driver circuit 702, the scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Display Device]

Figure 11B:
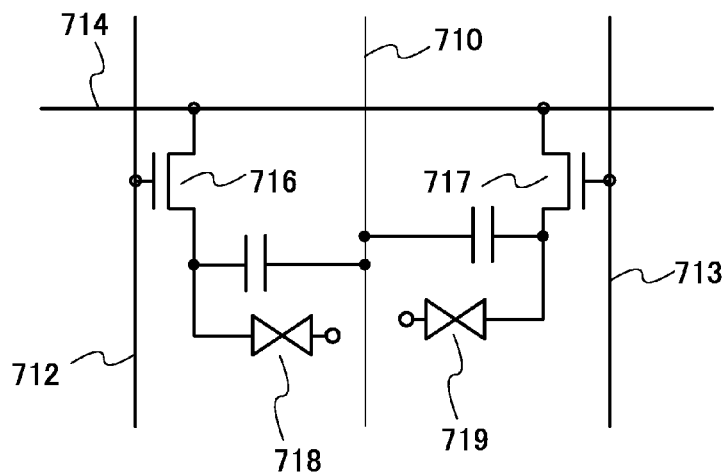

FIG. 11B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a data line 714 is shared by the transistors 716 and 717. The transistor described in any of the above embodiments can be used as appropriate as each of the transistors 716 and 717. Thus, a highly reliable liquid crystal display device can be provided.

A first pixel electrode layer is electrically connected to the transistor 716 and a second pixel electrode layer is electrically connected to the transistor 717. The first pixel electrode layer and the second pixel electrode layer are separated. There is no particular limitation on the shapes of the first pixel electrode layer and the second pixel electrode layer. For example, the first pixel electrode layer may have a V-like shape.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Furthermore, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 11B. For example, a switch, a resistor, a capacitor, a transistor, a sensor, a logic circuit, or the like may be added to the pixel circuit illustrated in FIG. 11B.

[Organic EL Display Device]

Figure 11C:
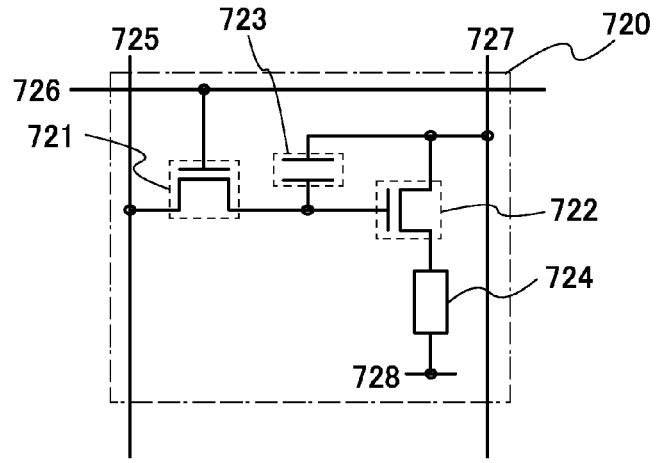

FIG. 11C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 11C illustrates an applicable example of a pixel circuit. Here, one pixel includes two n-channel transistors.

Note that the metal oxide film of one embodiment of the present invention can be used for a channel formation region of the n-channel transistor. Further, digital time grayscale driving can be employed for the pixel circuit.

The configuration of the applicable pixel circuit and operation of a pixel employing digital time grayscale driving will be described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, any of the transistors described in other embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that the gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 will be described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage higher than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 11C. For example, a switch, a resistor, a capacitor, a sensor, a transistor, a logic circuit, or the like may be added to the pixel circuit illustrated in FIG. 11C.

In the case where the transistor shown in any of the above embodiments is used for the circuit shown in FIGS. 11A to 11C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by an electrical or magnetic effect may be included. Note that examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

Note that this embodiment can be combined with any of the other embodiments in this specification as appropriate.

(Embodiment 7)

In this embodiment, examples of an electronic device to which the display device of one embodiment of the present invention can be applied will be described with reference to FIGS. 12A to 12D.

Examples of an electronic device including the display device include television sets (also referred to as televisions or television receivers), monitors of computers or the like, cameras such as digital cameras or digital video cameras, digital photo frames, mobile phones (also referred to as cellular phones or mobile phone devices), portable game machines, portable information terminals, audio reproducing devices, and large game machines such as pachinko machines. Specific examples of these electronic devices are illustrated in FIGS. 12A to 12D.

Figure 12A:
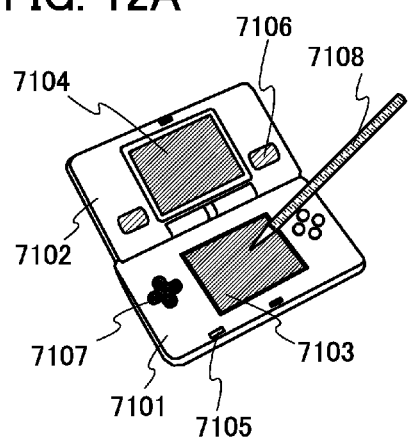
FIGS. 12A to 12D illustrate electronic devices of one embodiment of the present invention.

FIG. 12A illustrates a portable game machine including a housing 7101, a housing 7102, a display portion 7103, a display portion 7104, a microphone 7105, speakers 7106, an operation key 7107, a stylus 7108, and the like. The display device according to one embodiment of the present invention can be used for the display portion 7103 or the display portion 7104. When the display device according to one embodiment of the present invention is used as the display portion 7103 or 7104, it is possible to provide a user-friendly portable game machine with quality that hardly deteriorates. Although the portable game machine illustrated in FIG. 12A includes two display portions, the display portion 7103 and the display portion 7104, the number of display portions included in the portable game machine is not limited to two.

Figure 12B:
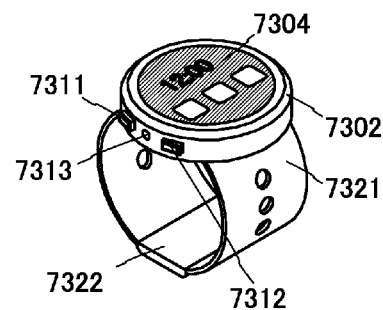

FIG. 12B illustrates a smart watch, which includes a housing 7302, a display portion 7304, operation buttons 7311 and 7312, a connection terminal 7313, a band 7321, a clasp 7322, and the like. The display device according to one embodiment of the present invention can be used for the display portion 7304.

Figure 12C:
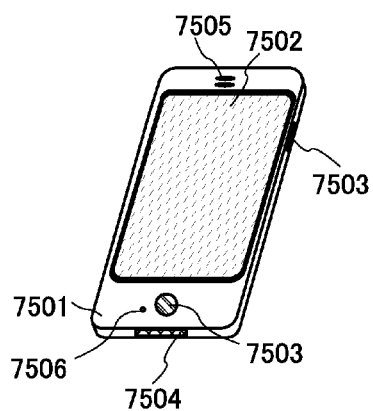

FIG. 12C illustrates a portable information terminal, which includes a display portion 7502 incorporated in a housing 7501, operation buttons 7503, an external connection port 7504, a speaker 7505, a microphone 7506, and the like. The display device of one embodiment of the present invention can be used for the display portion 7502.

Figure 12D:
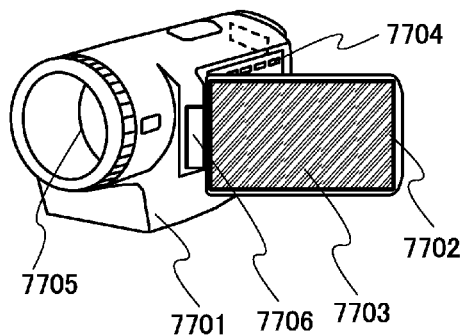

FIG. 12D illustrates a video camera, which includes a first housing 7701, a second housing 7702, a display portion 7703, operation keys 7704, a lens 7705, a joint 7706, and the like. The operation keys 7704 and the lens 7705 are provided for the first housing 7701, and the display portion 7703 is provided for the second housing 7702. The first housing 7701 and the second housing 7702 are connected to each other with the joint 7706, and the angle between the first housing 7701 and the second housing 7702 can be changed with the joint 7706. Images displayed on the display portion 7703 may be switched in accordance with the angle at the joint 7706 between the first housing 7701 and the second housing 7702. The display device according to one embodiment of the present invention can be used for the image display portion 7703.

Note that this embodiment can be combined with any of the other embodiments in this specification as appropriate.

This application is based on Japanese Patent Application serial No. 2014-181552 filed with Japan Patent Office on Sep. 5, 2014, the entire contents of which are hereby incorporated by reference.

What is claimed is:

1. A display device comprising:
   first and second circuits over a substrate,
   wherein the first circuit is included in a display portion,
   wherein the second circuit is included in a driver circuit portion,
   wherein the second circuit includes a transistor and a capacitor,
   wherein the transistor comprises:
      an oxide semiconductor layer over a first insulating layer; and
      source and drain electrodes electrically connected to the oxide semiconductor layer,
      wherein a second insulating layer is provided over the oxide semiconductor layer,
   wherein the capacitor comprises:
      a first conductive layer over the first insulating layer; and
      a second conductive layer over the first conductive layer with a third insulating layer therebetween,
      wherein the third insulating layer is provided over the second insulating layer and is in contact with the first conductive layer,
      wherein one of the source and drain electrodes is electrically connected to the second conductive layer,
      wherein the first conductive layer and the oxide semiconductor layer include the same metal element, and
      wherein the first conductive layer and the second conductive layer each have a light-transmitting property.

2. The display device according to claim 1, further comprising:
   an adhesive layer over the capacitor,
   wherein the first conductive layer and the second conductive layer each overlap with the adhesive layer.

3. The display device according to claim 2, wherein the adhesive layer comprises any one of an epoxy resin, an acrylic resin, a silicone resin, a phenol resin, a polyimide resin, an imide resin, a polyvinyl chloride resin, a polyvinyl butyral resin, an ethylene vinyl acetate resin and silica.

4. The display device according to claim 1, wherein the first conductive layer includes a region with a hydrogen concentration higher than that of the oxide semiconductor layer.

5. The display device according to claim 1, wherein the second insulating layer includes a silicon nitride film.

6. The display device according to claim 1, wherein the first circuit includes a liquid crystal element.

7. The display device according to claim 1, wherein the first circuit includes an organic EL element.

8. A display module comprising the display device according to claim 1, wherein a printed circuit is electrically connected to the display device.

9. A display device comprising:
first and second circuits over a substrate,
wherein the first circuit is included in a display portion,
wherein the second circuit is included in a driver circuit portion,
wherein the second circuit includes a transistor, a first capacitor and a second capacitor,
wherein the transistor comprises:
an oxide semiconductor layer over a first insulating layer; and
source and drain electrodes electrically connected to the oxide semiconductor layer,
wherein a second insulating layer is provided over the oxide semiconductor layer,
wherein the first capacitor comprises:
a first conductive layer over the first insulating layer; and
a second conductive layer over the first conductive layer with a third insulating layer therebetween,
wherein the second capacitor comprises:
a third conductive layer; and
the first conductive layer over the third conductive layer with the first insulating layer therebetween,
wherein the third insulating layer is provided over the second insulating layer and is in contact with the first conductive layer,
wherein one of the source and drain electrodes is electrically connected to the second conductive layer,
wherein the first conductive layer and the oxide semiconductor layer include the same metal element, and
wherein the first conductive layer, the second conductive layer, and the third conductive layer each have a light-transmitting property.

10. The display device according to claim 9, wherein the first capacitor and the second capacitor overlap with each other.

11. The display device according to claim 9, wherein the second conductive layer and the third conductive layer are electrically connected to each other.

12. The display device according to claim 9, further comprising:
an adhesive layer over the capacitor,
wherein the first conductive layer and the second conductive layer each overlap with the adhesive layer.

13. The display device according to claim 12, wherein the adhesive layer comprises any one of an epoxy resin, an acrylic resin, a silicone resin, a phenol resin, a polyimide resin, an imide resin, a polyvinyl chloride resin, a polyvinyl butyral resin, an ethylene vinyl acetate resin and silica.

14. The display device according to claim 9, wherein the second insulating layer includes a silicon nitride film.

15. The display device according to claim 9, wherein the first circuit includes a liquid crystal element.

16. The display device according to claim 9, wherein the first circuit includes an organic EL element.

17. A display module comprising the display device according to claim 9, wherein a printed circuit is electrically connected to the display device.

* * * * *